(12) United States Patent
Hidaka

(10) Patent No.: US 6,865,103 B2
(45) Date of Patent: Mar. 8, 2005

(54) THIN FILM MAGNETIC MEMORY DEVICE HAVING A REDUNDANT STRUCTURE

(75) Inventor: Hideto Hidaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/153,737

(22) Filed: May 24, 2002

(65) Prior Publication Data

US 2003/0099130 A1 May 29, 2003

(30) Foreign Application Priority Data

Nov. 27, 2001 (JP) ........................................ 2001-360441

(51) Int. Cl.$^7$ .............................................. G11C 11/00
(52) U.S. Cl. ........................ 365/158; 365/171; 365/200
(58) Field of Search ................................ 365/158, 171, 365/200, 210, 209, 189.01, 230.07, 213

(56) References Cited

U.S. PATENT DOCUMENTS 6,385,111 B2 * 5/2002 Tran et al. .................. 365/210
6,477,081 B2 * 11/2002 Poechmueller .............. 365/158

OTHER PUBLICATIONS

Scheuerlein et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94–95, 128–129, 409–410.
Durlam et al., "Nonvolatile RAM based on Magnetic Tunnel Junction Elements", ISSCC Digest of Technical Papers, TA7.3, Feb. 2000, pp. 96–97, 130–131, 410–411.
Naji et al., "A 256kb 3.0V 1T1MTJ Nonvolatile Magnetoresistive RAM", ISSCC Digest of Technical Papers, TA7.6, Feb. 2001, pp. 94–95, 122–123, 404–405, 438.

* cited by examiner

Primary Examiner—David Lam
(74) Attorney, Agent, or Firm—McDermott Will & Emery LLP

(57) ABSTRACT

In data write operation, a data write current starts being supplied to a write word line of the selected row at a first time without waiting for redundant determination. A data write current starts being supplied to a bit line or sub bit line of the selected column at a second time that is later than the first time according to the redundant determination result. The redundant determination is conducted between the first and second times. The data write currents flowing through the write word line and the bit line generate magnetic fields of the hard-axis and easy-axis directions for the selected memory sell, respectively.

45 Claims, 14 Drawing Sheets

THIN FILM MAGNETIC MEMORY DEVICE HAVING A REDUNDANT STRUCTURE

BACKGROUND OF THE INVENTION

1. Field of the Invention

The present invention generally relates to a thin film magnetic memory device. More particularly, the present invention relates to a thin film magnetic memory device having a redundant structure.

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves the performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 14 schematically shows the structure of a memory cell having a magnetic tunnel junction (hereinafter, sometimes simply referred to as "MTJ memory cell").

Referring to FIG. 14, the MTJ memory cell includes a tunneling magneto-resistance element TMR having its electric resistance varying according to the storage data level, and an access element ATR for forming a path of a sense current Is that flows through tunneling magneto-resistance element TMR in data read operation. Access element ATR is typically formed from a field effect transistor. Therefore, access element ATR is hereinafter sometimes referred to as access transistor ATR. Access transistor ATR is coupled between the tunneling magneto-resistance element TMR and a fixed voltage (ground voltage Vss).

For the MTJ memory cell are provided a write word line WWL for data write operation, a read word line RWL for data read operation, and a bit line BL. Bit line BL serves as a data line for transmitting an electric signal corresponding to the storage data level in both data read and write operations.

FIG. 15 is a conceptual diagram illustrating data read operation from the MTJ memory cell.

Referring to FIG. 15, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction according to an external magnetic field (hereinafter, sometimes simply referred to as "free magnetic layer"). A tunneling barrier (tunneling film) TB of an insulator film is interposed between fixed magnetic layer FL and free magnetic layer VL. Free magnetic layer VL is magnetized either in the direction that is the same as or opposite to that of fixed magnetic layer FL according to the write data level. Fixed magnetic layer FL, tunneling barrier TB and free magnetic layer VL form a magnetic tunnel junction.

In data read operation, access transistor ATR is turned ON in response to activation of read word line RWL. This allows sense current Is to flow through a current path formed by bit line BL, tunneling magneto-resistance element TMR, access transistor ATR and ground voltage Vss.

The electric resistance of tunneling magneto-resistance element TMR varies according to the relation between the respective magnetization directions of fixed magnetic layer FL and free magnetic layer VL. More specifically, when fixed magnetic layer FL and free magnetic layer VL have the same (parallel) magnetization direction, tunneling magneto-resistance element TMR has a lower electric resistance as compared to the case where they have opposite (antiparallel) magnetization directions.

Accordingly, when free magnetic layer VL is magnetized in the direction according to the storage data, a voltage change produced at tunneling magneto-resistance element TMR by sense current Is varies according to the storage data level. Therefore, applying sense current Is to tunneling magneto-resistance element TMR after precharging bit line BL to a fixed voltage would enable the storage data in the MTJ memory cell to be read by sensing the voltage on bit line BL.

FIG. 16 is a conceptual diagram illustrating data write operation to the MTJ memory cell.

Referring to FIG. 16, in data write operation, read word line RWL is inactivated, and access transistor ATR is turned OFF. In this state, a data write current for magnetizing free magnetic layer VL in the direction according to the write data is applied to write word line WWL and bit line BL. The magnetization direction of free magnetic layer VL is determined by the respective data write currents flowing through write word line WWL and bit line BL.

FIG. 17 is a conceptual diagram illustrating the relation between the data write current and the magnetization direction of the tunneling magneto-resistance element in the data write operation to the MTJ memory cell.

Referring to FIG. 17, the abscissa H(EA) indicates a magnetic field that is applied in the easy axis (EA) direction in free magnetic layer VL of tunneling magneto-resistance element TMR. The ordinate H(HA) indicates a magnetic field that is applied in the hard axis (HA) direction in free magnetic layer VL. Magnetic fields H(EA), H(HA) respectively correspond to two magnetic fields produced by the currents flowing through bit line BL and write word line WWL.

In the MTJ memory cell, fixed magnetic layer FL is magnetized in the fixed direction along the easy axis of free magnetic layer VL. Moreover, free magnetic layer VL is magnetized either in the same (parallel) direction as, or in the opposite (antiparallel) direction to, that of fixed magnetic layer FL along the easy axis, according to the storage data level ("1" and "0"). In the specification, it is assumed that tunneling magneto-resistance element TMR has electric resistance values Rmax and Rmin (Rmax>Rmin) respectively corresponding to the above two magnetization directions of free magnetic layer VL. The MTJ memory cell is thus capable of storing 1-bit data ("1" and "0") corresponding to the two magnetization directions of free magnetic layer VL.

The magnetization direction of free magnetic layer VL can be rewritten only when the sum of the applied magnetic fields H(EA) and H(HA) reaches the region outside the asteroid characteristic line shown in the figure. In other words, the magnetization direction of free magnetic layer VL will not change if an applied data write magnetic field corresponds to the region inside the asteroid characteristic line.

As shown by the asteroid characteristic line, applying a magnetic field of the hard axis direction to free magnetic layer VL enables reduction in a magnetization threshold value required to change the magnetization direction along the easy axis.

When the operation point of the data write operation is designed as in the example of FIG. 17, a data write magnetic field of the easy axis direction is designed to have a strength $H_{WR}$ in the MTJ memory cell to be written. In other words, the value of the data write current to be applied across bit line BL or write word line WWL is designed to produce data write magnetic field $H_{WR}$. In general, data write magnetic field $H_{WR}$ is defined by the sum of a switching magnetic field Hsw required to switch the magnetization direction and a margin $\Delta H$. Data write magnetic field $H_{WR}$ is thus defined by $H_{WR} = H_{SW} + \Delta H$.

In order to rewrite the storage data of the MTJ memory cell, that is, the magnetization direction of tunneling magneto-resistance element TMR, a data write current of at least a prescribed level must be applied to both write word line WWL and bit line BL. Free magnetic layer VL in tunneling magneto-resistance element TMR is thus magnetized either in the same (parallel) direction as, or in the opposite (antiparallel) direction to, that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

The electric resistance of tunneling magneto-resistance element TMR thus varies according to the magnetization direction that is rewritable by an applied data write magnetic field. Accordingly, non-volatile data storage can be realized by using the two magnetization directions of free magnetic layer VL of tunneling magneto-resistance element TMR as the respective storage data levels ("0" and "1").

In order to improve the manufacturing yield, a memory device commonly includes not only a plurality of normal memory cells that are selected according to an address signal but also a redundant structure for replacing a defective normal memory cell, if any.

In such a redundant structure, a defective memory cell is replaced with a spare memory on a section-by-section basis. Accordingly, for the memory device having the redundant structure, whether or not an input address signal matches a fault address designating a defective memory cell must be determined in both data read and write operations. Even the MRAM device having the redundant structure must be designed so that the time required for such determination does not significantly affect the operation speed.

In order to write data to the MTJ memory cell in the MRAM device, that is, in order to rewrite the magnetization direction of the tunneling magneto-resistance element, the data write magnetic fields of two directions are applied as described in FIG. 17. Accordingly, if the data write magnetic fields do not properly change with time, the operation of magnetizing the tunneling magneto-resistance element is destabilized, thereby possibly resulting in erroneous write operation.

SUMMARY OF THE INVENTION

It is an object of the present invention to provide a thin film magnetic memory device having a redundant structure and capable of stably operating at a high speed.

According to one aspect of the present invention, a thin film magnetic memory device for selecting an address according to an address signal including first and second addresses includes a plurality of normal memory cells, a plurality of spare memory cells, a redundant control circuit, a selection circuit, a plurality of write selection lines, a plurality of data lines, a plurality of spare data lines, and a data input/output (I/O) circuit.

The normal memory cells and the spare memory cells are arranged in a matrix. The spare memory cells replace a defective memory cell in the plurality of normal memory cells. Each normal memory cell and each spare memory cell include a magneto-resistance element having its electric resistance varying according to a magnetization direction that is rewritable in response to application of both a first prescribed magnetic field along a hard axis and a second prescribed magnetic field along an easy axis. The redundant control circuit compares the address signal with a fault address designating the defective memory cell, and conducts redundant determination to determine whether the defective memory cell is selected or not based on the comparison result. In data write operation, the selection circuit conducts row selection for each of the plurality of normal memory cells and the plurality of spare memory cells according to the first address regardless of the redundant determination. The plurality of write selection lines are selectively activated according to the row selection to pass a first data write current therethrough in order to apply the first prescribed magnetic field to a normal memory cell group and a spare memory cell group of the selected row. The plurality of data lines are arranged respectively corresponding to the normal memory cell columns. The plurality of spare data lines are arranged respectively corresponding to the spare memory cell columns. The data I/O circuit controls data input/output to/from the plurality of normal memory cells and the plurality of spare memory cells according to the redundant determination. In the data write operation, the data I/O circuit supplies a second data write current to either data lines corresponding to the second address, or data lines and a spare data line corresponding to the second address according to the redundant determination. The second data write current is a current for generating the second prescribed magnetic field.

Preferably, the first data write current has a fixed direction regardless of write data, and a direction of the second data write current is set according to a level of the write data.

In the data write operation, the above thin film magnetic memory device applies a magnetic field of the hard-axis direction to both the normal and spare memory cells selected according to the address signal without waiting for the redundant determination. Moreover, the above thin film magnetic memory device starts applying a magnetic field of the easy-axis direction based on the redundant determination result. Generation of a magnetically unstable, intermediate state is thus prevented by utilizing the time required for the redundant determination, thereby enabling stable, high-speed data write operation to be implemented.

According to another aspect of the present invention, a thin film magnetic memory device for selecting an address according to an address signal including first and second addresses includes a plurality of normal memory cells, a plurality of spare memory cells, a redundant control circuit, a selection circuit, a plurality of read selection lines, a plurality of data lines, a plurality of spare data lines, a first data read circuit, a second data read circuit, and a data input/output (I/O) circuit. The plurality of spare memory cells replace a defective memory cell in the plurality of normal memory cells. The normal memory cells and the spare memory cells are arranged in a matrix. Each normal memory cell and each spare memory cell includes a magneto-resistance element having its electric resistance varying according to a magnetization direction that is rewritable in response to application of both first and second prescribed write magnetic fields, and an access element electrically coupled in series with the magneto-resistance element, and selectively turned ON to pass a data read current therethrough in a data read operation.

The redundant control circuit compares the address signal with a fault address designating the defective memory cell and conducting redundant determination to determine whether the defective memory cell is selected or not based on the comparison result. The selection circuit conducts row selection for each of the plurality of normal memory cells and the plurality of spare memory cells according to the first address regardless of the redundant determination in data read operation. The plurality of read selection lines are selectively activated according to the row selection to turn ON the access element in each of a normal memory cell group and a spare memory cell group of the selected row. The plurality of data lines are arranged respectively corresponding to the normal memory cell columns, and respectively connected to the normal memory cells of the selected row in the data read operation. The plurality of spare data lines are arranged respectively corresponding to the spare memory cell columns, and respectively connected to the spare memory cells of the selected row in the data read operation. The first data read circuit supplies the data read current to selected data lines regardless of the redundant determination in the data read operation. The selected data lines are selected from the plurality of data lines according to the second address. The second data read circuit supplies the data read current to at least one selected spare data line regardless of the redundant determination in the data read operation. The data input/output (I/O) circuit receives a plurality of read data from the selected data lines and the at least one selected spare data line receiving the data read current, and selectively outputs a part of the plurality of read data based on the redundant determination, in the data read operation.

The above thin film magnetic memory device is capable of initiating the data read operation of both normal memory cells and spare memory cells in parallel without waiting for the redundant determination. This minimizes the influence of the time required for the redundant determination, enabling high-speed data read operation to be implemented.

According to still another aspect of the present invention, a thin film magnetic memory device for selecting an address according to an address signal including first and second addresses includes a plurality of normal memory cells, a plurality of spare memory cells, a redundant control circuit, a selection circuit, a plurality of write selection lines, a plurality of data lines, a plurality of spare data lines, and a data input/output (I/O) circuit.

The normal memory cells and the spare memory cells are arranged in a matrix so as to share memory cell rows. The spare memory cells replace a defective memory cell in the plurality of normal memory cells. Each normal memory cell and each spare memory cell include a magneto-resistance element having its electric resistance varying according to a magnetization direction that is rewritable in response to application of both first and second prescribed magnetic write fields. The redundant control circuit compares the address signal with a fault address designating the defective memory cell and conducting redundant determination to determine whether the defective memory cell is selected or not based on the comparison result. The selection circuit conducts row selection for each of the plurality of normal memory cells and the plurality of spare memory cells according to the first address regardless of the redundant determination in data write operation. The plurality of write selection lines are arranged respectively corresponding to the memory cell rows. The plurality of write selection lines are selectively activated according to the row selection to pass a first data write current therethrough in order to apply the first prescribed magnetic field to a normal memory cell group and a spare memory cell group of the selected row. The plurality of data lines are arranged respectively corresponding to the normal memory cell columns. The plurality of spare data lines are arranged respectively corresponding to the spare memory cell columns. The data I/O circuit controls data input/output to/from the plurality of normal memory cells and the plurality of spare memory cells according to the redundant determination. In the data write operation, the data I/O circuit supplies a second data write current to either data lines corresponding to the second address, or data lines and a spare data line corresponding to the second address according to the redundant determination. The second data write current is a current for generating the second prescribed magnetic field. The data I/O circuit controls data input/output to/from the plurality of normal memory cells and the plurality of spare memory cells according to the redundant determination. The defective memory cell is replaced with one of the spare memory cells of the same memory cell row.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
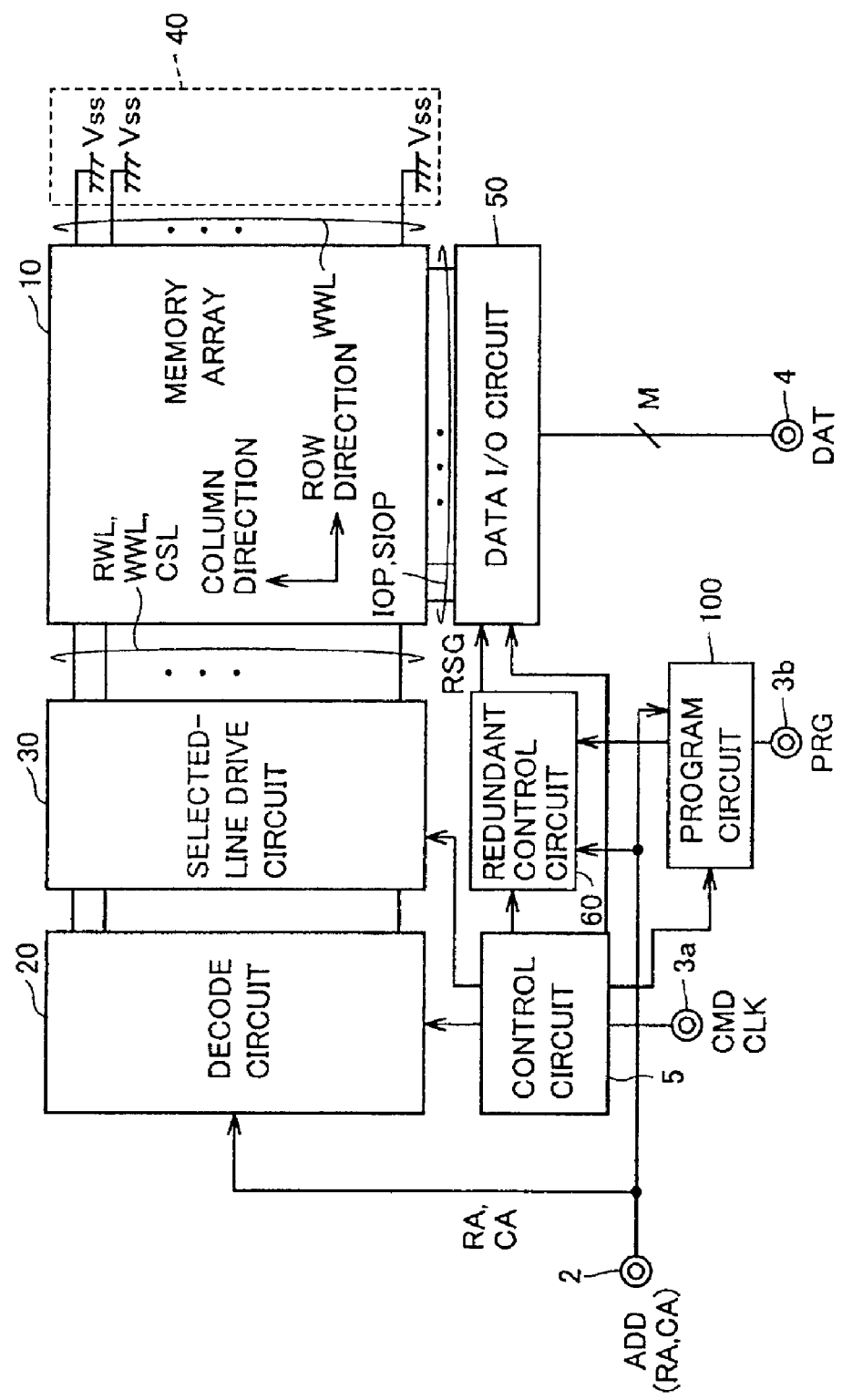
FIG. 1 is a schematic block diagram of the overall structure of an MRAM device according to a first embodiment of the present invention.

Referring to FIG. 1, an MRAM device 1 receives and outputs an M-bit data signal DAT (where M is a natural number) according to an external control signal CMD and an external address signal ADD. Data read and write operations in MRAM device 1 are conducted in synchronization with, e.g., an external clock signal CLK. The operation timing may alternatively be determined internally without receiving external clock signal CLK.

MRAM device 1 includes an address terminal 2 receiving address signal ADD, a signal terminal 3a receiving control signal CMD and clock signal CLK, a signal terminal 3b receiving a program signal PRG that is activated for the programming operation, and a data terminal 4 receiving and outputting M-bit data signal DAT.

MRAM device 1 further includes a control circuit 5 for controlling the overall operation of MRAM device 1 in response to control signal CMD and clock signal CLK, and a memory array 10 having a plurality of MTJ memory cells arranged in a matrix.

Memory array 10 includes a plurality of normal MTJ memory cells (hereinafter, sometimes referred to as "normal memory cells") arranged in a matrix, and spare memory cells for replacing a defective normal memory cell, if any (hereinafter, sometimes referred to as "defective memory cell"). The normal MTJ memory cells and the spare memory cells are selectable according to address signal ADD. The structure of memory array 10 will be specifically described later.

A plurality of write word lines WWL and a plurality of read word lines RWL are arranged corresponding to the MTJ memory cell rows (hereinafter, sometimes simply referred to as "memory cell rows"). Column selection lines CSL for selecting a column are also arranged in memory array 10. Data is read from or written to memory array 10 through normal data input/output (I/O) line pairs IOP and a spare data input/output (I/O) line pair SIOP. Normal data I/O line pairs IOP correspond to the normal memory cells, and spare data I/O line pair SIOP corresponds to the spare memory cells. Hereinafter, normal data I/O line pair IOP is sometimes simply referred to as data I/O line pair IOP.

MRAM device 1 further includes a decode circuit 20, a selected-line drive circuit 30, a data input/output (I/O) circuit 50, a redundant control circuit 60, and a program circuit 100.

Decode circuit 20 performs row and column selection based on address signal ADD. Selected-line drive circuit 30 controls activation of read word line RWL, write word line WWL, column selection line CSL and other selected lines according to the row and column selection results of decode circuit 20. Each write word line WWL is coupled to ground voltage Vss in a region 40 that faces selected-line drive circuit 30 with memory array 10 interposed therebetween.

Program circuit 100 stores a fault address designating a defective memory cell as program information in a non-volatile manner. The fault address is externally applied to program circuit 100 through, e.g., address terminal 2 in program data write operation in which program signal PRG is activated. The fault address is read from program circuit 100 according to the instruction from control circuit 5.

In normal operation, redundant control circuit 60 compares address signal ADD with the fault address retained in program circuit 100, and determines whether or not a defective memory cell is selected for read or write operation, based on the comparison result. Redundant control circuit 60 produces a redundant control signal RSG reflecting the redundant determination result.

As specifically described later, decode circuit 20 and selected-line drive circuit 30 conducts row and column selection according to address signal ADD without waiting for the redundant determination result. In other words, address selection for read and write operations is started in parallel for both normal memory cells and spare memory cells. This improves the operation speed of the MRAM device having a redundant structure.

Data I/O circuit 50 controls the connection between data I/O line pair IOP and spare data I/O line pair SIOP and data terminal 4 according to redundant control signal RSG in order to replace a defective memory cell. More specifically, if redundant control circuit 60 determines that input address signal ADD does not match the fault address, M-bit data is read or written by using only data I/O line pair IOP corresponding to the normal memory cells. On the other hand, if redundant control circuit 60 determines that address signal ADD matches the fault address, data I/O line pair IOP corresponding to the selected defective memory cell is replaced with spare data I/O line pair SIOP to read or write the M-bit data.

Figure 2:
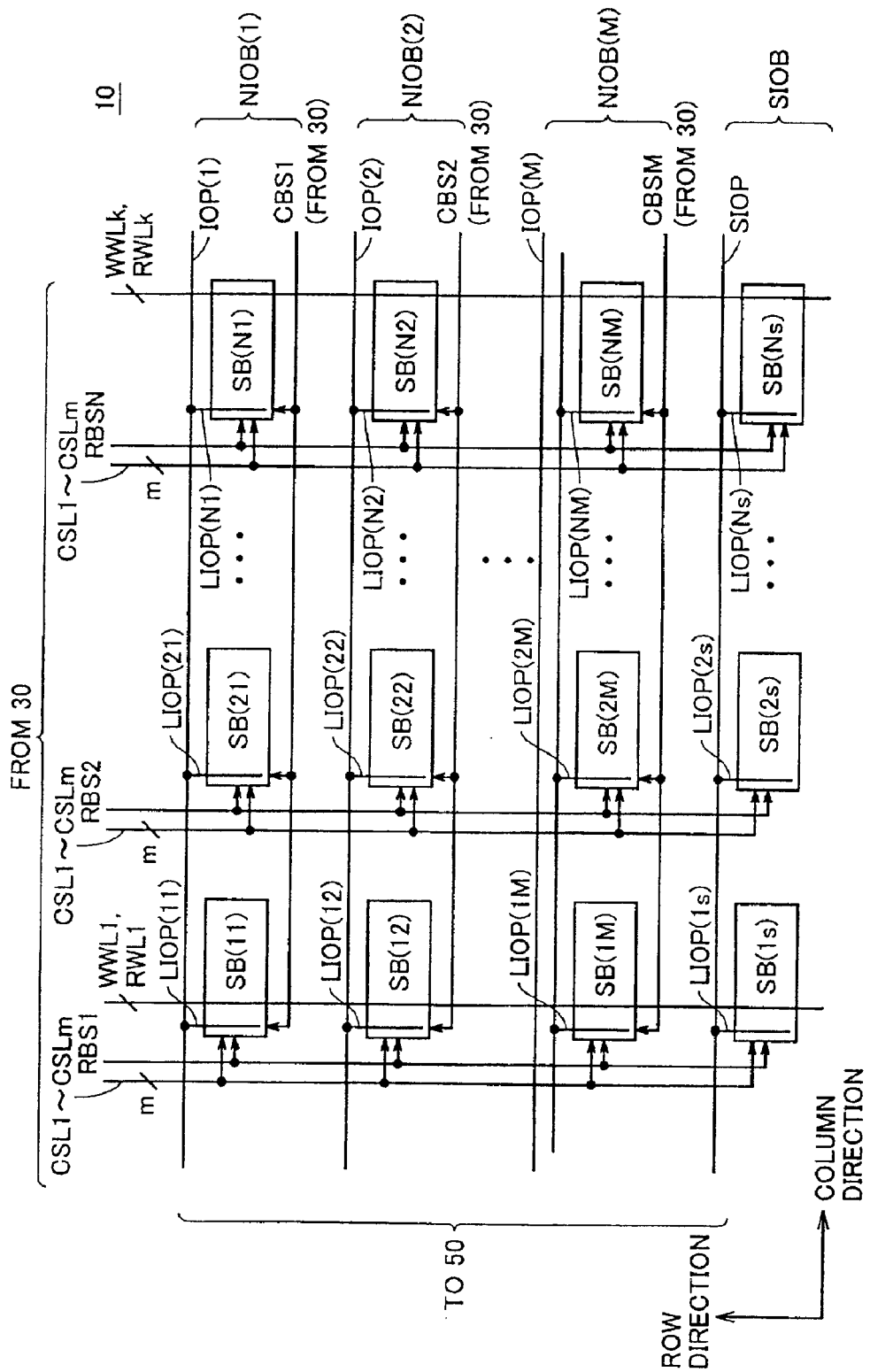
FIG. 2 is a block diagram of the structure of a memory array in FIG. 1.

Referring to FIG. 2, memory array 10 is divided into N×(M+1) sub blocks SB(11) to SB(NM) and SB(1s) to SB(Ns) arranged in a matrix (where N is a natural number). Hereinafter, these sub blocks are sometimes generally referred to as sub blocks SB.

Sub blocks SB(11) to SB(NM) include normal memory cells, and sub blocks SB(1s) to SB(Ns) include spare memory cells. Each of sub blocks SB have the same structure. As specifically described later, each sub block SB has a plurality of normal memory cells or spare memory cells arranged in n rows by m columns (where n, m are a natural number).

These normal memory cells and spare memory cells are arranged in a matrix so as to share the memory cell rows in the entire memory array 10. In other words, provided that memory array 10 has k memory cell rows, k=(N×n). Write word lines WWL1 to WWLk and read word lines RWL1 to RWLk are arranged corresponding to the k memory cell rows. Hereinafter, write word lines WWL1 to WWLk are sometimes generally referred to as write word lines WWL, and read word lines RWL1 to RWLk are sometimes generally referred to as read word lines RWL.

Each write word line WWL and each read word line RWL are shared by normal memory cells and spare memory cell of a corresponding memory cell row. As a result, activation of write word line WWL and activation of read word line RWL are each conducted in parallel for the normal and spare memory cells, according to the row selection result.

M sub block columns of sub blocks SB(11) to SB(NM) form normal IO blocks NIOB(1) to NIOB(M), respectively. A sub block column of sub blocks SB(1s) to SB(Ns) forms a spare IO block SIOB.

Normal IO blocks NIOB(1) to NIOB(M) are selectable according to block column selection signals CBS1 to CBSM, respectively. N sub block rows of sub blocks SB(11) to SB(NM), SB(1s) to SB(Ns) hereinafter, sometimes referred to as "block rows") are selectable according to block row selection signals RBS1 to RBSN, respectively. Hereinafter, block row selection signals RBS1 to RBSN are sometimes generally referred to as block row selection signals RBS.

Data I/O line pairs IOP(1) to IOP(M) are arranged corresponding to normal IO blocks NIOB(1) to NIOB(M), respectively. Spare data I/O line pair SIOP is arranged corresponding to spare IO block SIOB. Hereinafter, normal IO blocks NIOB(1) to NIOB(M) are sometimes generally referred to as normal IO blocks NIOB, and data I/O line pairs IOP(1) to IOP(M) are sometimes generally referred to as data I/O line pairs IOP.

Local data input/output (I/O) line pairs LIOP(11) to LIOP(NM) are respectively arranged in sub blocks SB(11) to SB(NM) of normal IO blocks NIOB. Similarly, local data input/output (I/O) line pairs LIOP(1s) to LIOP(Ns) are respectively arranged in sub blocks SB(1s) to SB(Ns) of spare IO block SIOB. Note that, hereinafter, local data I/O line pairs LIOP(11) to LIOP(NM) are sometimes generally referred to as local data I/O line pairs LIOP, and local data I/O line pairs LIOP(1s) to LIOP(Ns) are sometimes generally referred to as spare local data I/O line pairs SLIOP.

Connection switches in each sub block SB control the connection between local data I/O line pair LIOP or spare local data I/O line pair SLIOP and a corresponding data I/O line pair IOP or spare data I/O line pair SIOP.

In data read and write operations, a single memory cell row is selected according to a row address RA included in address signal ADD (hereinafter, this memory cell row is sometimes referred to as "selected row"). A block row of (M+1) sub blocks SB including the selected row is then selected, and a corresponding block row selection signal RBS is activated to H level. Note that, in the specification, the binary voltage states of a signal, data, signal line and data line are simply referred to as "H level" and "L level".

In each of the (M+1) sub blocks SB including the selected row, one of m memory cell columns is selected in response to activation of column selection line CSL1 to CSLm. In each sub block, a single normal memory cell or spare memory cell is selected for read or write operation. As a result, in memory array 10, data can be read from and written to the selected (M+1) normal and spare memory cells through data I/O line pairs IOP(1) to IOP(M) and spare data I/O line pairs SIOP, respectively.

Hereinafter, the structure of the sub blocks will be described specifically.

Figure 3:
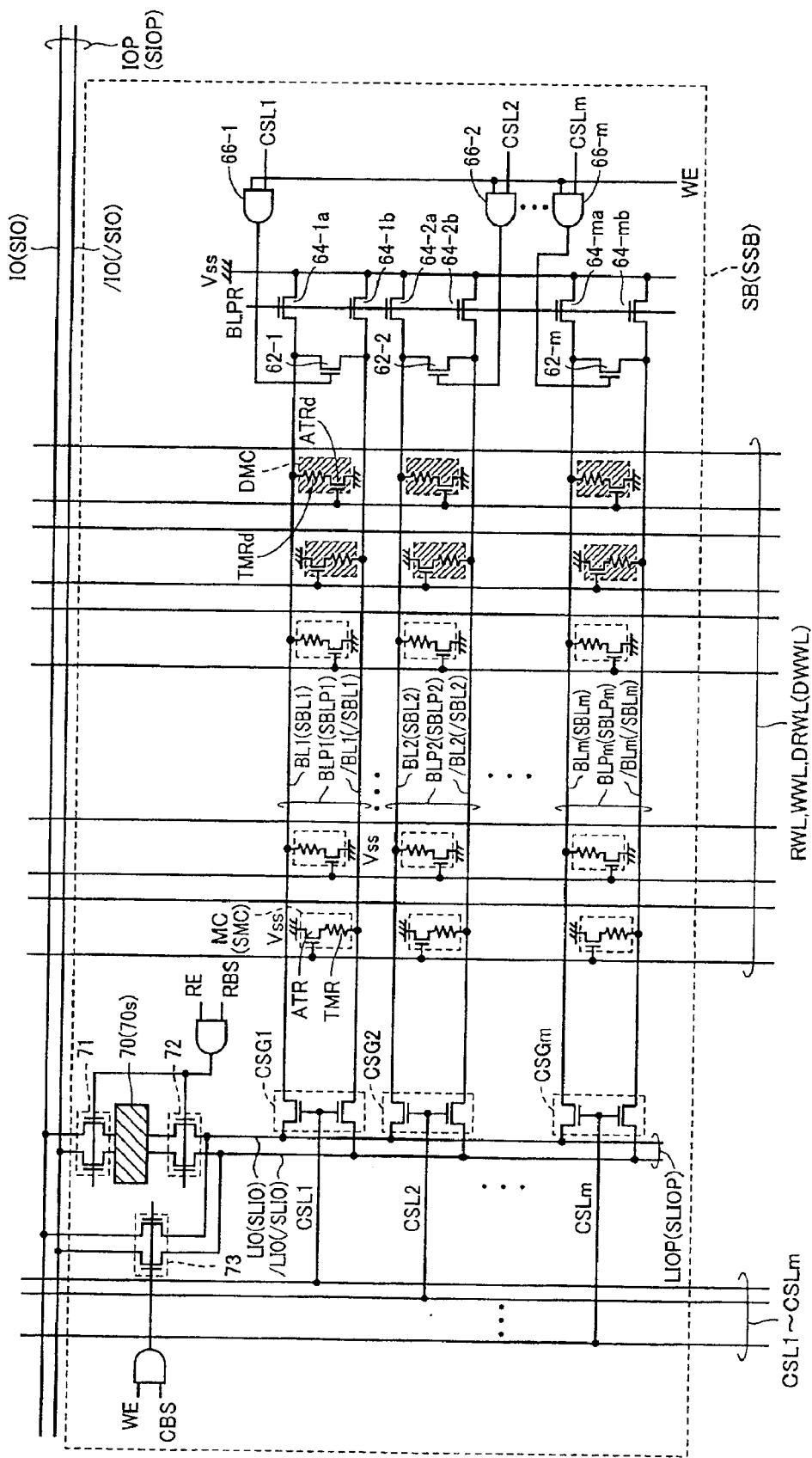
FIG. 3 is a circuit diagram of the structure of a sub block.

In FIG. 3, the structure of the sub block corresponding to the normal IO block will be described by way of example.

Referring to FIG. 3, sub block SB includes normal memory cells MC arranged in n rows by m columns, dummy memory cells DMC arranged in two rows by m columns, a local data I/O line pair LIOP, column selection gates CSG1 to CSGm corresponding to the respective memory cell columns, a data read circuit 70, and connection switches 71, 72, 73 for controlling the connection between a corresponding data I/O line pair IOP and local data I/O line pair LIOP. Local data I/O line pair LIOP includes complementary local data I/O lines LIO and /LIO.

Read word lines RWL1 to RWLn and write word lines WWL1 to WWLm are arranged corresponding to the respective memory cell rows. Read word lines RWL and write word lines WWL are shared by a plurality of sub blocks SB of the same block row.

Bit lines BL1, /BL1 to BLm, /BLm are arranged corresponding to the respective memory cell columns. Bit lines BL1, /BL1 to BLm, /BLm form bit line pairs BLP1 to BLPm, respectively. Hereinafter, bit line pairs BLP1 to BLPm, bit lines BL1 to BLm, and bit lines /BL1 to /BLm are sometimes generally referred to as bit line pairs BLP, bit lines BL, and bit lines /BL, respectively. Bit lines BL, /BL are independently provided in each sub block.

Normal memory cells MC in each row are connected to either bit line BL or /BL. For example, regarding the normal memory cells of the first memory cell column, the normal memory cell of the first row is connected to bit line /BL1, and the normal memory cell of the second row is connected to bit line BL1. Similarly, the MTJ memory cells of the odd rows are connected to one bit lines of the bit line pairs, i.e., /BL1 to /BLm, whereas the MTJ memory cells of the even rows are connected to the other bit lines of the bit line pairs, i.e., BL1 to BLm.

Each normal memory cell MC includes a tunneling magneto-resistance element TMR having its electric resistance varying according to the storage data level, and an access transistor ATR serving as an access element. Tunneling magneto-resistance element TMR and access transistor ATR are connected in series with each other. As described before, a MOS (Metal Oxide Semiconductor) transistor, a field effect transistor formed on the semiconductor substrate, is typically used as access transistor ATR.

Tunneling magneto-resistance element TMR is connected in series with access transistor ATR between bit line BL or /BL and ground voltage Vss. Access transistor ATR has its gate coupled to a corresponding read word line RWL. Access transistor ATR is turned ON in response to activation of read word line RWL to H level, and electrically couples tunneling magneto-resistance element TMR between a corresponding bit line BL(/BL) and ground voltage Vss. When read word line RWL is inactive (L level), access transistor ATR is turned OFF and electrically disconnects tunneling magneto-resistance element TMR from bit line BL (/BL).

Each sub block SB further includes a plurality of dummy memory cells DMC respectively coupled to bit lines BL1, /BL1 to BLm, /BLm. Dummy memory cells DMC are arranged in two rows by m columns, and correspond to either dummy read word line DRWL1 or DRWL2. Dummy memory cells DMC corresponding to dummy read word line DRWL1 are respectively coupled to bit lines BL1, BL2 to BLm. The remaining dummy memory cells DMC corresponding to dummy read word line DRWL2 are respectively coupled to bit lines /BL1, /BL2 to /BLm.

Each dummy memory cell DMC includes a dummy resistance element TMRd and a dummy access element ATRd. Electric resistance Rd of dummy resistance element TMRd is set to an intermediate value between electric resistance values Rmax and Rmin, i.e., Rmax>Rd>Rmin. Electric resistance values Rmax and Rmin respectively correspond to storage data levels "1" and "0" of MTJ memory cell MC. Like the access element of the MTJ memory cell, dummy access element ATRd is typically formed from a field effect transistor. Hereinafter, the dummy access element is sometimes referred to as dummy access transistor ATRd.

Dummy write word lines DWWL1, DWWL2 are arranged corresponding to the respective dummy memory cell rows. Note that the dummy write word lines may be eliminated depending on the structure of the dummy resistance element TMRd. However, dummy write word lines DWWL1, DWWL2 having the same design as that of write word lines WWL are herein provided in order to ensure the continuity of the profile on the memory array and thus to prevent the manufacturing process from being complicated.

When an odd row is selected for read operation according to the row selection result, bit lines /BL1 to /BLm are respectively coupled to MTJ memory cells MC. In this case, dummy read word line DRWL1 is activated so that bit lines BL1 to BLm are respectively coupled to dummy memory cells DMC. On the other hand, when an even row is selected, bit lines BL1 to BLm are respectively coupled to MTJ memory cells MC. In this case, dummy read word line DRWL2 is activated so that bit lines /BL1 to /BLm are respectively coupled to dummy memory cells DMC. Hereinafter, dummy read word lines DRWL1, DRWL2 are sometimes generally referred to as dummy read word lines DRWL.

In data write operation, selected-line drive circuit 30 couples write word line WWL of the selected row to power supply voltage Vcc at its one end. This allows a data write current Ip of the row direction to be applied from selected-line drive circuit 30 across the selected write word line WWL toward region 40 in FIG. 1. Selected-line drive circuit 30 couples the write word lines of the non-selected rows to ground voltage Vss.

In data read operation, selected-line drive circuit 30 selectively activates read word line RWL and dummy read word line DRWL1, DRWL2 to H level (power supply voltage Vcc) according to the row selection result. As described before, when an odd row is selected, the MTJ memory cell group of the selected row is connected to bit lines /BL1 to /BLm. Therefore, selected-line drive circuit 30 activates dummy read word line DRWL1 in order to connect the dummy memory cell group to bit lines BL1 to BLm. Similarly, when an even row is selected, selected-line drive circuit 30 activates dummy read word line DRWL2.

Column selection lines CSL1 to CSLm for selecting a column are arranged respectively corresponding to m memory cell columns of each sub block. In both data read and write operations, selected-line drive circuit 30 activates one of column selection lines CSL1 to CSLm to the selected state (H level) according to the decode result of column address CA, that is, according to the column selection result.

Column selection lines CSL1 to CSLm are shared by (M+1) sub blocks SB of the same block row. Accordingly, in each sub block of the selected block row, one of m memory cell columns is selected, whereby a single normal memory cell or spare memory cell is selected for read or write operation.

Each sub block SB further includes column selection gates CSG1 to CSGm corresponding to the respective memory cell columns. Since column selection gates CSG1 to CSGm have the same structure, the structure of column selection gate CSG1 corresponding to bit lines BL1, /BL1 will be described exemplarily.

Column selection gate CSG1 includes a transistor switch electrically coupled between local data I/O line LIO and bit line BL1, and a transistor switch electrically coupled between local data I/O line /LIO and bit line /BL1. These transistor switches are turned ON/OFF according to the voltage on column selection line CSL1. More specifically, when column selection line CSL1 is activated to the selected state (H level), column selection gate CSG1 electrically couples local data I/O lines LIO, /LIO to bit lines BL1, /BL1, respectively.

Note that, hereinafter, column selection lines CSL1 to CLSm and column selection gates CSG1 to CSGm are sometimes generally referred to as column selection lines CSL and column selection gates CSG, respectively.

Sub block SB further includes short-circuit switch transistors 62-1 to 62-m and control gates 66-1 to 66-m both corresponding to the respective memory cell columns. Sub block SB further includes precharge transistors 64-1a, 64-1b to 64-ma, 64-mb respectively provided between bit lines BL1, /BL1 to BLm, /BLm and ground voltage Vss. Hereinafter, short-circuit switch transistors 62-1 to 62-m, precharge transistors 64-1a, 64-1b to 64-ma, 64-mb and control gates 66-1 to 66-m are sometimes generally referred to as short-circuit switch transistors 62, precharge transistors 64 and control gates 66, respectively.

Each control gate 66 outputs the AND operation result of a corresponding column selection line CSL and control signal WE. Therefore, the output of control gate 66 corresponding to the selected column is selectively activated to H level in data write operation.

Short-circuit switch transistor 62 is turned ON/OFF in response to the output of a corresponding control gate 66. In data write operation, bit lines BL, /BL corresponding to the selected column are electrically coupled together at their one ends through short-circuit switch transistor 62 in each sub block.

Precharge transistors 64 are turned ON in response to activation of bit line precharge signal BLPR, and precharges respective bit lines BL1, BL1 to BLm, /BLm to ground voltage Vss. Bit line precharge signal BLPR produced by control circuit 5 is activated to H level at least for a prescribed period before read operation in the active period of MRAM device 1. In both data read and write operations in the active period of MRAM device 1, bit line precharge signal BLPR is inactivated to L level, and precharge transistors 64 are thus turned OFF.

Connection switches 71, 72 are turned ON in response to selection of a corresponding block row (block row selection signal RBS is at H level) in data read operation (control signal RE is at H level). Connection switches 71, 72 are otherwise turned OFF. Connection switch 73 is turned ON in response to selection of a corresponding block row (block row selection signal RBS is at H level) in data write operation (control signal WE is at H level). Connection switch 73 is otherwise turned OFF.

Figure 4:
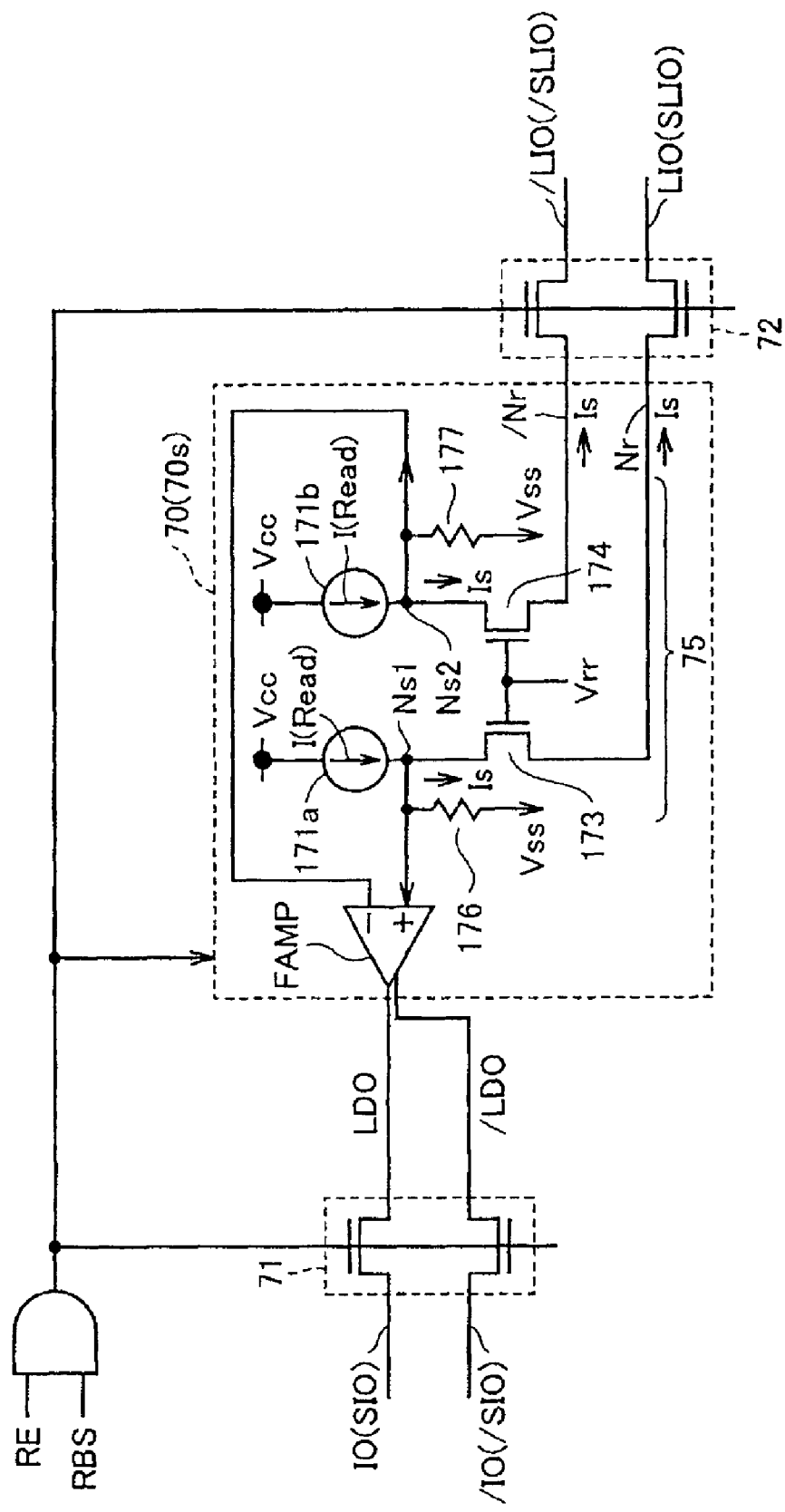
FIG. 4 is a circuit diagram of the structure of a data read circuit in FIG. 3.

Referring to FIG. 4, data read circuit 70 includes a sense current supply portion 75 and a read amplifier FAMP.

Sense current supply portion 75 includes constant current supply circuits 171a, 171b, an N-channel MOS transistor 173, an N-channel MOS transistor 174, and resistors 176, 177. Constant current supply circuits 171a, 171b receive power supply voltage Vcc and supply a constant current I(Read) to nodes Ns1, Ns2, respectively. N-channel MOS transistor 173 is electrically coupled between nodes Ns1 and Nr. N-channel MOS transistor 174 is electrically coupled between nodes Ns2 and /Nr. Resistors 176, 177 pull respective nodes Ns1, Ns2 down to ground voltage Vss. N-channel MOS transistors 173, 174 receive a reference voltage Vrr at their respective gates.

Sense current supply portion 75 is thus capable of supplying sense current (data read current) Is corresponding to constant current I(Read) to nodes Nr, /Nr when the corresponding block column is selected for data read operation. Nodes Nr, /Nr are electrically coupled to local data I/O lines LIO, /LIO through connection switch 72, respectively. Accordingly, in each memory block of the selected block row, local data I/O lines LIO, /LIO of local data I/O line pair LIOP are connected to data read circuit 70 and receive sense current Is in data read operation.

As described before, in data read operation, each local data I/O line LIO, /LIO is pulled down to ground voltage Vss through bit line BL or /BL of the selected column and the selected memory cell or dummy memory cell. In each sub block of the selected block column, the voltage difference is thus produced between nodes Ns1 and Ns2 in data read circuit 70 according to the storage data in the selected memory cell.

Read amplifier FAMP amplifies the voltage level difference between nodes Ns1 and Ns2 and outputs complimentary read data LDO, /LDO. Read data LDO, /LDO are respectively transmitted to data I/O lines IO, /IO through connection switch 71.

In data write operation, local data I/O lines LIO, /LIO are electrically coupled to corresponding data I/O lines IO, /IO in response to ON of connection switch 73, respectively.

In order to distinguish the sub blocks of normal memory cells from those of spare memory cells, sub blocks SB(1s) to SB(Ns) of spare IO block SIOB in FIG. 2 are hereinafter sometimes generally referred to as spare sub blocks SSB.

Referring back to FIG. 3, each spare sub block SSB includes spare memory cells SMC arranged in n rows by m columns instead of normal memory cells MC. Each spare memory cell SMC is designed to have the same structure and characteristics as those of normal memory cell MC.

Instead of bit line pairs BLP1 to BLPm, each spare sub block SSB includes spare bit line pairs SBLP1 to SBLPm arranged corresponding to the respective spare memory cell columns. Spare bit line pairs SBLP1 to SBLPm include spare bit lines SBL1, /SBL1 to SBLm, /SBLm, respectively.

Similarly, each spare sub block SSB includes a spare local data I/O line pair SLIOP instead of local data I/O line pair LIOP, and a data read circuit 70s instead of data read circuit 70. Spare local data I/O line pair SLIOP is composed of spare local data I/O lines SLIO, /SLIO.

Although some elements in spare sub block SSB are distinguished from those in sub block SB by name, each spare sub block SSB has the same structure as that of sub block SB including normal memory cells, as shown in FIG. 3.

In data write operation, one of m memory cell columns is thus selected in each of sub blocks SB and spare sub block SSB of the selected block row. As a result, one ends of corresponding bit lines BL, /BL (or spare bit lines SBL, /SBL) are respectively connected to corresponding data I/O lines IO, /IO (or spare data I/O lines SIO, /SIO) through local data I/O lines LIO, /LIO (or spare local data I/O lines SLIO, /SLIO). The other ends of bit lines BL, /BL (or spare bit lines SBL, /SBL) of the selected column are electrically coupled together by corresponding short-circuit switch transistor 62.

On the other hand, in data read operation, short-circuit switch transistors 62 are turned OFF, and sense current Is is supplied to bit lines BL, /BL (or spare bit lines SBL, /SBL) of the selected column. Data read circuit 70 (or data read circuit 70s) thus produces read data LDO, /LDO corresponding to the storage data in the selected memory cell of the sub block (or spare sub block). Read data LDO, /LDO thus produced are transmitted to data I/O lines IO, /IO (or spare data I/O lines SIO, /SIO), respectively.

Figure 5:
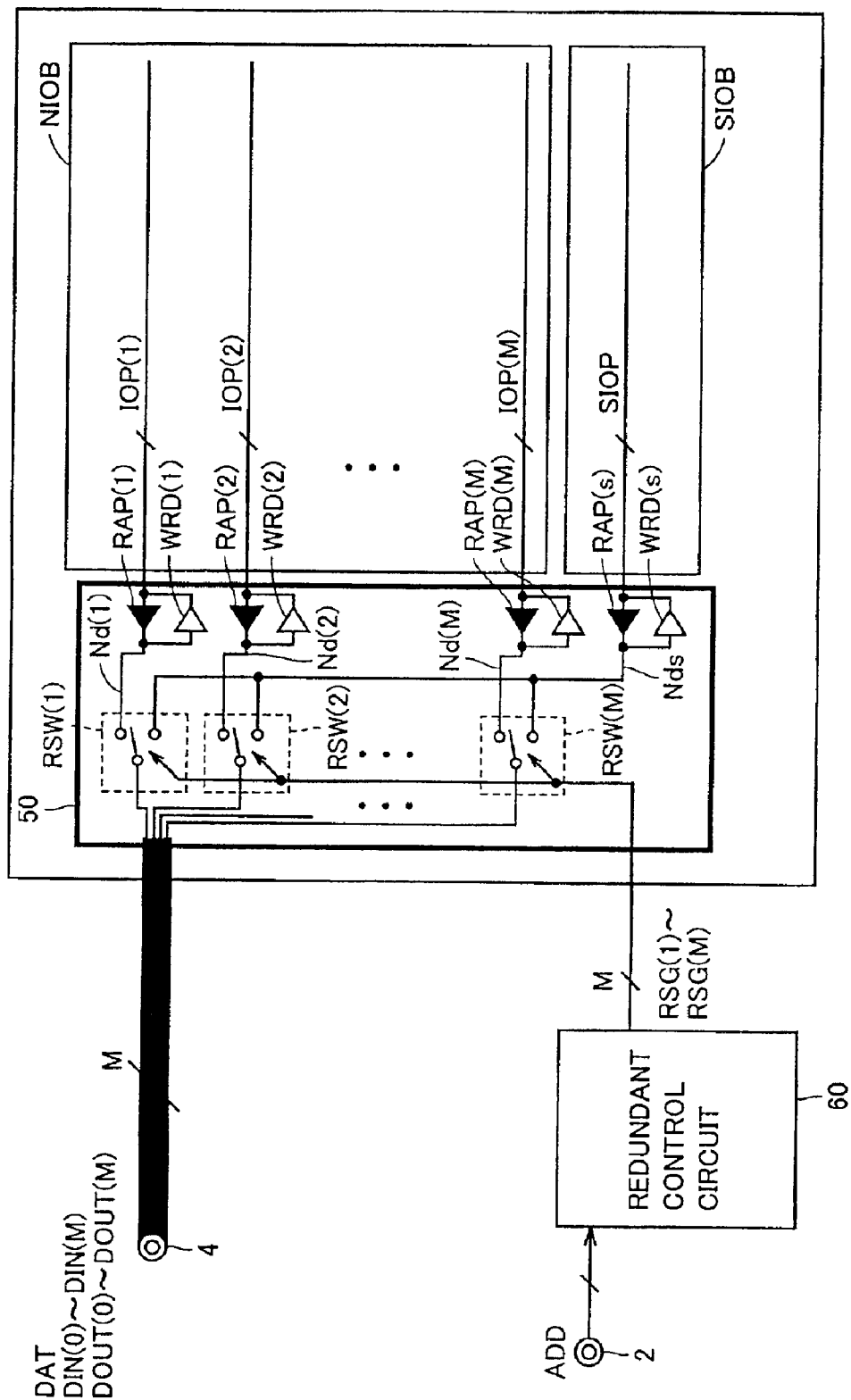
FIG. 5 is a block diagram of the structure of a data input/output (I/O) circuit in FIG. 1.

Referring to FIG. 5, regarding M-bit data signal DAT received and output through data terminal 4, read data that is output in the data read operation is denoted with DOUT(0) to DOUT(M), and write data that is received in the data write operation is denoted with DIN(0) to DIN(M). Write data DIN(0) to DIN(M) are sometimes generally referred to as write data DIN, and read data DOUT(0) to DOUT(M) are sometimes generally referred to as read data DOUT.

Data I/O circuit 50 includes read amplifiers RAP(1) to RAP(M) respectively corresponding to data I/O line pairs IOP(1) to IOP(M), and a read amplifier RAP(s) corresponding to spare data I/O line pair SIOP.

Data I/O circuit 50 further includes write drivers WRD(1) to WRD(M) and WRD(s) respectively corresponding to data I/O line pairs IOP(1) to IOP(m) and spare data I/O line pair SIOP.

Note that, hereinafter, read amplifiers RAP(1) to RAP(M), RAP(s) are sometimes generally referred to as read amplifiers RAP, and write drivers WRD(1) to WRD(M), WRD(s) are sometimes generally referred to as write drivers WRD.

Each read amplifier RAP(1) to RAP(M) outputs read data to a corresponding data node Nd(1) to Nd(M) according to the voltage difference produced between complementary data I/O lines of a corresponding data I/O line pair IOP(1) to IOP(M) in data read operation. Like read amplifiers RAP(1) to RAP(M), read amplifier RAP(s) outputs read data to a spare data node Nds according to the voltage difference between complementary spare data I/O lines of spare data I/O line pair SIOP. Hereinafter, data nodes Nd(1) to Nd(M) are sometimes generally referred to as data node Nd.

Each write driver WRD(1) to WRD(M) drives a voltage on a corresponding data I/O line pair IOP according to write data DIN transmitted to a corresponding data node Nd. Write driver WRD(s) drives a voltage on spare data I/O line pair SIOP according to write data DIN transmitted to spare data node Nds.

Figure 6:
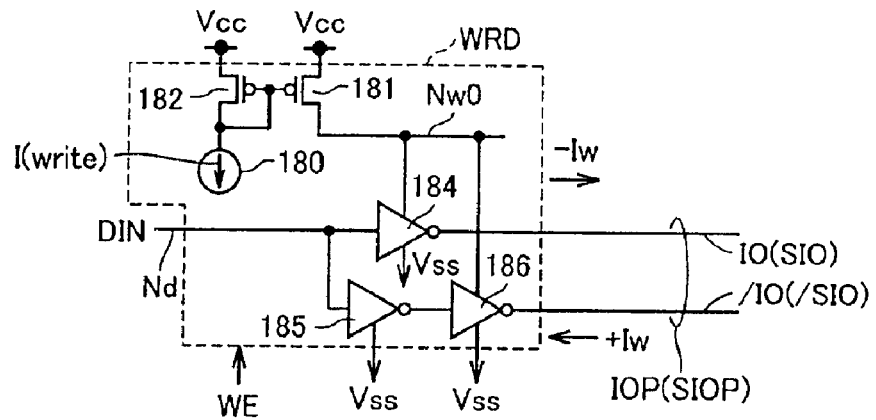
FIG. 6 is a circuit diagram of the structure of a write driver in FIG. 5.

Referring to FIG. 6, write driver WRD includes a constant current supply circuit 180 for supplying a constant current I(write), and P-channel MOS transistors 181, 182 forming a current mirror. A current is thus supplied to node Nw0 according to constant current I(write).

Write driver WRD further includes inverters 184, 185, 186 operating with an operating current received through node Nw0. Inverters 184, 185, 186 receive power supply voltage Vcc and ground voltage Vss for operation.

Inverter 184 inverts the voltage level of write data DIN for transmission to data I/O lines IO (or spare data I/O line SIO). Inverter 185 inverts the voltage level of write data DIN for transmission to input node of inverter 186. Inverter 186 inverts the output of inverter 185 for transmission to data I/O line /IO (or spare data I/O line /SIO). Write driver WRD thus sets the respective voltages on data I/O lines IO, /IO (or spare data I/O lines SIO, /SIO) to power supply voltage Vcc and ground voltage Vss, or vice versa, according to the level of write data DIN.

If no write data DIN is transmitted to a corresponding write driver WRD, corresponding data I/O lines IO, /IO (or spare data I/O lines SIO, /SIO) are held at a precharge voltage level (e.g., ground voltage Vss) by a not-shown precharge circuit.

Referring back to FIG. 3, when the write data is transmitted to a data node of write driver WRD, the voltages on local data I/O lines LIO, /LIO (or spare local data I/O lines SLIO, /SLIO) connected to that write driver WRD through data I/O lines IO, /IO (or spare data I/O lines SIO, /SIO and connection switch 73 are respectively set to power supply voltage Vcc and ground voltage Vss, or vice versa.

This allows a data write current ±Iw of the direction corresponding to the write data (DIN) level to be supplied to the selected column of each sub block of the selected block row. More specifically, the data write current ±Iw sequentially flows through local data I/O line LIO (/LIO), column selection gate CSG, bit line BL (/BL), short-circuit switch transistor 62, bit line /BL (BL), column selection gate CSG, and local data I/O line /LIO (LIO).

Similarly, a data write current ±Iw of the direction corresponding to the write data (DIN) level is also applied to the selected column of the spare sub block of the selected block row. More specifically, the data write current ±Iw sequentially flows trough spare local data I/O line SLIO (/SLIO), column selection gate CSG, spare bit line SBL (/SBL), short-circuit switch transistor 62, spare bit line /SBL (SBL), column selection gate CSG, and spare local data I/O line /SLIO (SLIO).

In contrast, when no write data DIN is transmitted to a corresponding write driver WRD, the voltages on local data I/O lines LIO, /LIO (or spare local data I/O lines SLIO, /SLIO) connected to that write driver WRD through data I/O lines IO, /IO (or spare data I/O lines SIO, /SIO) and connection switch 73 are held at the precharge voltage (ground voltage Vss). Accordingly, no data write current ±Iw is applied to bit lines BL, /BL (or spare bit lines SBL, /SBL) of the selected column in each of the sub blocks and spare sub block of the selected block row, and data write operation is not conducted.

Referring back to FIG. 5, data I/O circuit 50 further includes replace switches RSW(1) to RSW(M) between data terminal 4 and data nodes Nd(1) to Nd(M), respectively.

Each replace switch RSW(1) to RSW(M) electrically couples either a corresponding data node Nd or spare data node Nds to data terminal 4 according to a corresponding redundant control signal RSG(1) to RSG(M). For example, replace switch RSW(1) connects either data node Nd(1) or spare data node Nds to data terminal 4 according to redundant control signal RSG(1). The other replace switches RSW(2) to RSW(M) operate in the same manner as that of replace switch RSW(1). Hereinafter, replace switches RSW (1) to RSW(M) are sometimes generally referred to as replace switches RSW.

Redundant control circuit 60 produces redundant control signals RSG(1) to RSG(M) based on the redundant determination result.

Figure 7:
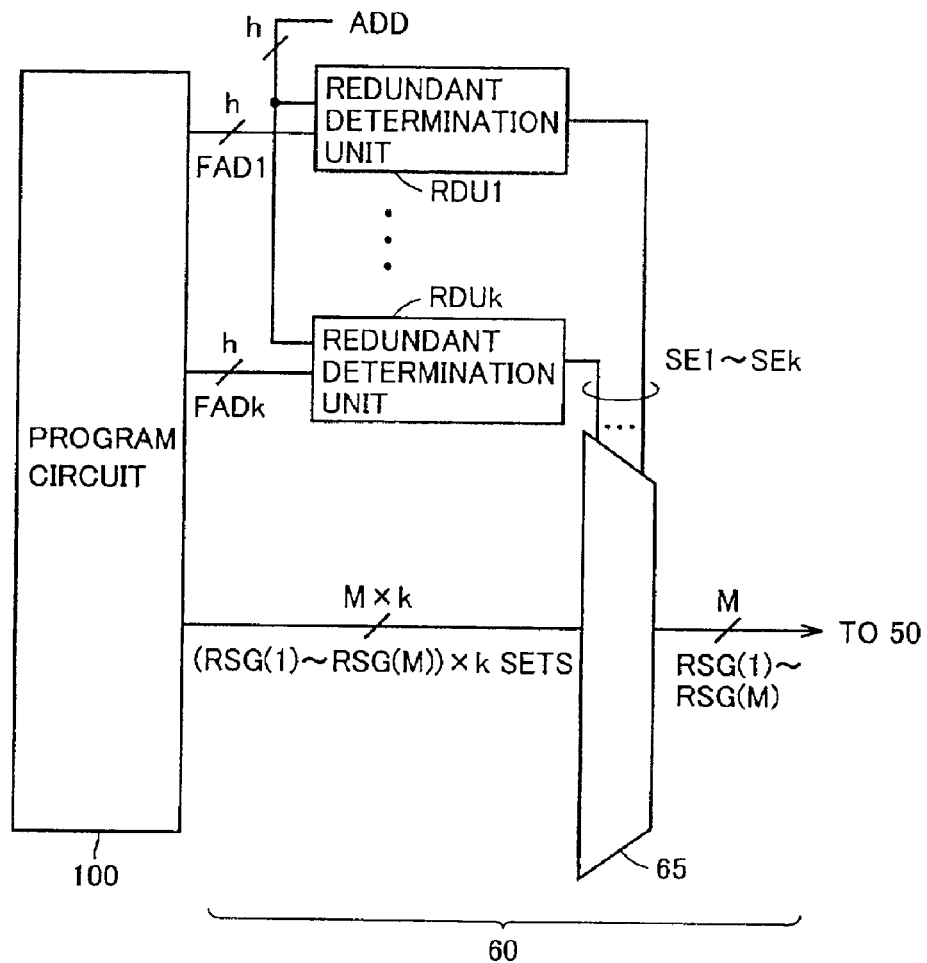
FIG. 7 is a circuit diagram of the structure of a redundant control circuit in FIG. 5.

Referring to FIG. 7, program circuit 100 stores fault addresses FAD1 to FADk designating a defective memory cell (where k is a natural number). Fault addresses FAD1 to FADk are sometimes generally referred to as fault addresses FAD.

When redundant replacement using data I/O line pair IOP is conducted in the memory array structure divided into sub blocks SB as shown in FIGS. 2 and 5, fault addresses FAD has h bits for specifying both a sub block and a memory cell column in that sub block in order to designate a defective memory cell. For example, each fault address FAD is formed from at least one bit of row address RA and column address CA (i.e., address signal APP).

Program circuit 100 further stores k sets of redundant control signals RSG(1) to RSG(M) respectively corresponding to fault addresses FAD1 to FADk. Each set of redundant control signals RSG(1) to RSG(M) indicates the respective connection directions of replace switches RSW(1) to RSW (M), which are required to replace a defective memory cell of the respective fault address FAD with a spare memory cell.

Redundant control circuit 60 further includes redundant determination units RDU1 to RDUk respectively corresponding to fault addresses FAD1 to FADk, and a signal selector 65. Each redundant determination unit RDU1 to RDUk receives a corresponding fault address FAD and h bits of address signal ADD, and compares them with each other. Each redundant determination unit RDU1 to RDUk outputs a corresponding spare enable signal SE1 to SEk based on the address comparison result. Each spare enable signal SE1 to SEk is activated to H level when address signal ADD matches a corresponding fault address FAD. The spare enable signals SE1 to SEk are otherwise inactivated to L level.

Signal selector 65 receives the k sets of redundant control signals RSG(1) to RSG(m) corresponding to the respective fault addresses FAD1 to FADk, and selectively outputs the received redundant control signals RSG(1) to RSG(m) according to spare enable signals SE1 to SEk. When any of fault addresses FAD1 to FADk matches address signal ADD, signal selector 65 outputs redundant control signals RSG(1) to RSG(M) corresponding to that fault address FAD.

In response to this, replace switch RSW corresponding to normal IO block NIOB including the defective memory cell connects spare data node Nds rather than a corresponding data node Nd to data terminal 4. On the other hand, if all spare enable signals SE1 to SEk are inactivated, that is, if address signal ADD does not match any fault address, each replace switch RSW connects a corresponding data node Nd to data terminal 4 according to respective redundant control signal RSG(1) to RSG(M). The defective memory cell can thus be replaced on the basis of a data I/O line pair.

Hereinafter, the operation timing of data write operation and data read operation in the MRAM device of the first embodiment will be described with reference to FIGS. 8A and 8B.

Figure 8A:
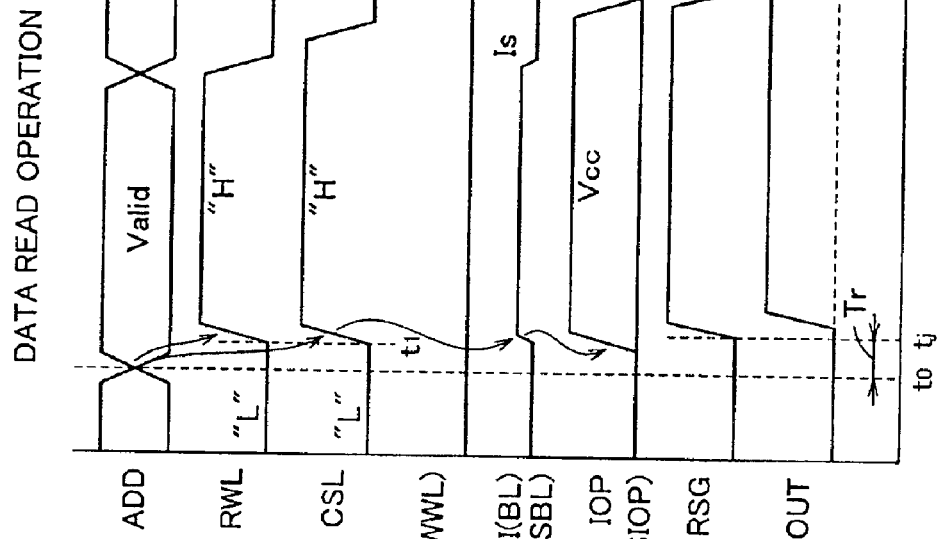
FIG. 8A is an operation waveform chart illustrating operation timing of data read operation in the MRAM device of the first embodiment.

Referring to FIG. 8A, data write operation is started at time t0. In response to valid address signal ADD and M-bit write data DIN (DIN(0) to DIN(M)), write word line WWL and column selection line CSL are activated according to address signal ADD without waiting for the redundant determination result of redundant control circuit 60.

Data write current Ip is supplied as soon as write word line WWL is activated at time t1. Note that data write current Ip generates a magnetic field of the hard axis (HA) direction in the tunneling magneto-resistance elements in the normal memory cells and spare memory cells of the selected row.

Redundant control circuit 60 completes the redundant determination after a time Tr required for the determination from time t0, that is, at time tj that is later than time t1. Replace switches RSW(1) to RSW(M) render their respective nodes Nd(1) to Nd(n) and spare data node Nds in open state during the period between t0 and tj. Accordingly, although the column selection signal line CSL of the selected column is activated, no bit line current I(BL) will be produced on corresponding bit lines or spare bit lines until redundant control signal RSG is set. In other words, no data write current ±Iw will flow therethrough. Note that bit line current I(BL) generates a magnetic field of the easy axis (EA) direction in the respective tunneling magneto-resistance elements of the normal memory cells and spare memory cells.

Once redundant control signal RSG is set based on the redundant determination result at time tj, write data DIN(1) to DIN(M) are then transmitted to M of (M+1) write drivers WRD, respectively. Each write driver WRD receiving write data DIN sets data I/O lines of a corresponding data I/O line pair IOP or spare data I/O lines of a corresponding spare data I/O line pair SIOP to power supply voltage Vcc and ground voltage Vss, respectively, according to the write data (DIN) level. On the other hand, write driver WRD receiving no write data DIN holds the corresponding two data I/O lines or spare data I/O lines at ground voltage Vss.

As a result, in the M sub blocks in the selected block row, a data write current ±Iw flows through the bit lines of the selected column as a bit line current I(BL) at time t2 later than time t1 and tj. The M sub blocks in the selected block row are those corresponding to the data I/O line pairs IOP (or spare data I/O line pairs SIOP) driven by the above M write drivers WRD. In these sub blocks, data write current Ip already flows through the write word line WWL of the selected row as a write word line current I(WWL). Therefore, data can be written to the normal memory cells or spare memory cell receiving both data write currents.

In other words, a defective memory cell is replaced with a spare memory cell sharing write word line WWL and read word line RWL with the defective memory cell, that is, a spare memory cell of the same memory cell row.

At the end of the data write operation, write word line WWL of the selected row is inactivated at time t3, and supply of write word line current I(WWL), i.e., data write current Ip, is discontinued. At time t4, column selection line CSL is inactivated, and supply of bit line current I(BL), i.e., data write current ±Iw, is discontinued.

By supplying the data write currents at the above timings, the tunneling magneto-resistance elements TMR in the normal memory cells or spare memory cell to be written are initially subjected to a data write magnetic field of the hard axis direction, and then to a data write magnetic field of the easy axis direction.

Moreover, an attenuation period of the data write magnetic field of the hard axis direction is provided at the end of the data write operation while the data write magnetic field of the easy axis direction is still applied at a prescribed level.

Hereinafter, magnetization behavior of the tunneling magneto-resistance element TMR in the data write operation will be described with reference to FIG. 9.

Figure 9:
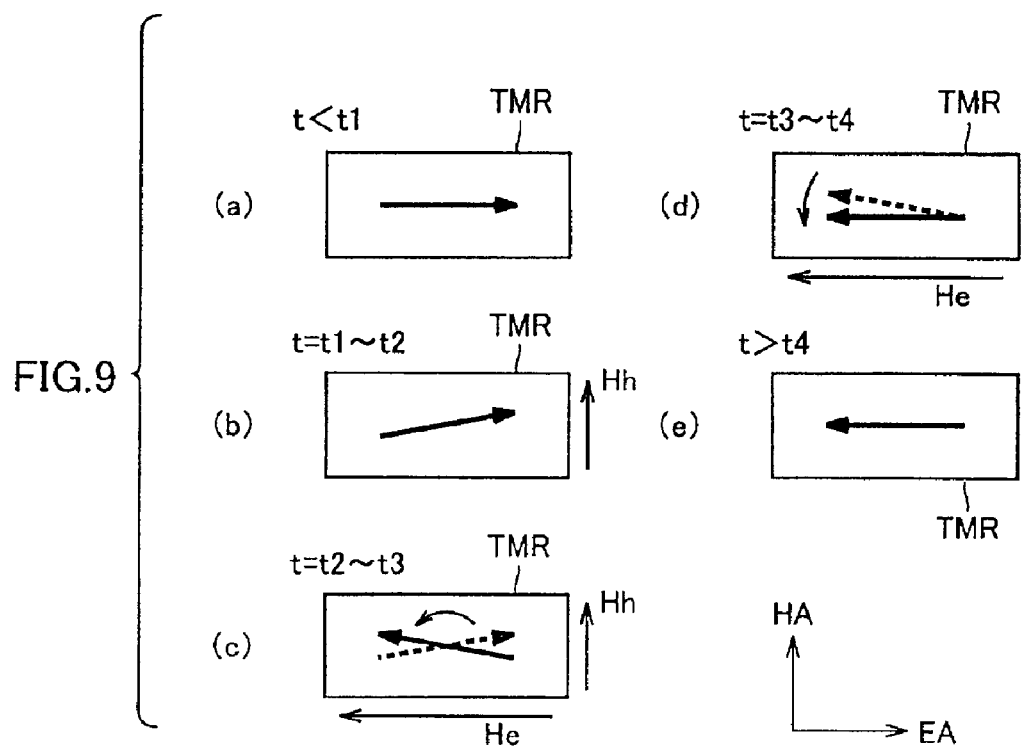
FIG. 9 is a conceptual diagram illustrating magnetization behavior of a tunneling magneto-resistance element in data write operation.

Referring to (a) in FIG. 9, before time t1 (t<t1), that is, before data write operation and before application of the data write current after the start of the data write operation, the free magnetic layer in the tunneling magneto-resistance element TMR is magnetized in a certain direction (rightward in (a) in FIG. 9) along the easy axis. Hereinafter, data write operation for rewriting the magnetization direction in (a) in FIG. 9 with the opposite direction will be described.

Referring to (b) in FIG. 9, in the period between t1 and t2 (t=t1 to t2), a data write magnetic field Hh of the hard axis (HA) direction is applied by data write current Ip flowing through write word line WWL. The magnetization direction of the free magnetic layer thus starts rotating gradually.

Figure 17:
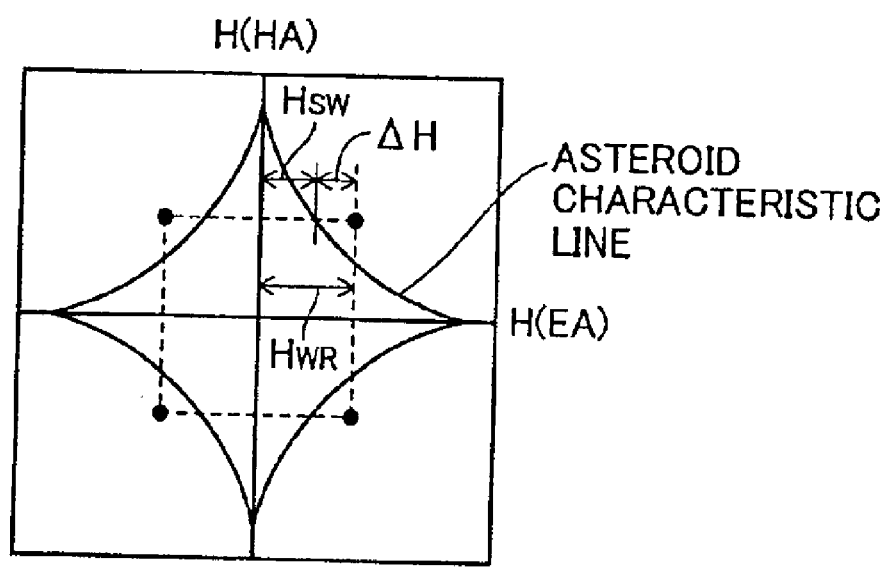
FIG. 17 is a conceptual diagram illustrating the relation between a data write current and the magnetization direction of a tunneling magneto-resistance element in the data write operation to the MTJ memory cell.

Referring to (c) in FIG. 9, in the period between t2 and t3 (t=t2 to t3), a data write magnetic field He of the easy axis (EA) direction is applied in order to reverse the magnetization direction of the free magnetic layer, while still applying the data write magnetic field Hh of the hard axis direction at a prescribed level. Once the sum of data write magnetic fields Hh and He reaches a region outside the asteroid characteristic line in FIG. 17, the magnetization direction of the free magnetic layer is reversed from the direction shown by the dotted arrow to that shown by the solid arrow in the figure.

Referring to (d) in FIG. 9, in the period between t3 and t4 (t=t3 to t4), data write magnetic field Hh of the hard axis direction attenuates while data write magnetic field He of the easy axis direction is still applied at the prescribed level. As a result, the vector sum of data write magnetic fields Hh and He changes to the magnetization rotation direction in (c) in FIG. 9 at the end of the data write operation.

As shown in (e) in FIG. 9, varying the data write magnetic fields Hh, He in the above order enables the magnetization direction of the free magnetic layer to be stably rewritten with the opposite direction in the data write operation without causing an undesirable intermediate magnetization state.

Hereinafter, the undesirable intermediate magnetization state of the free magnetic layer as generated in the data write operation will be described with reference to FIG. 10.

Figure 10:
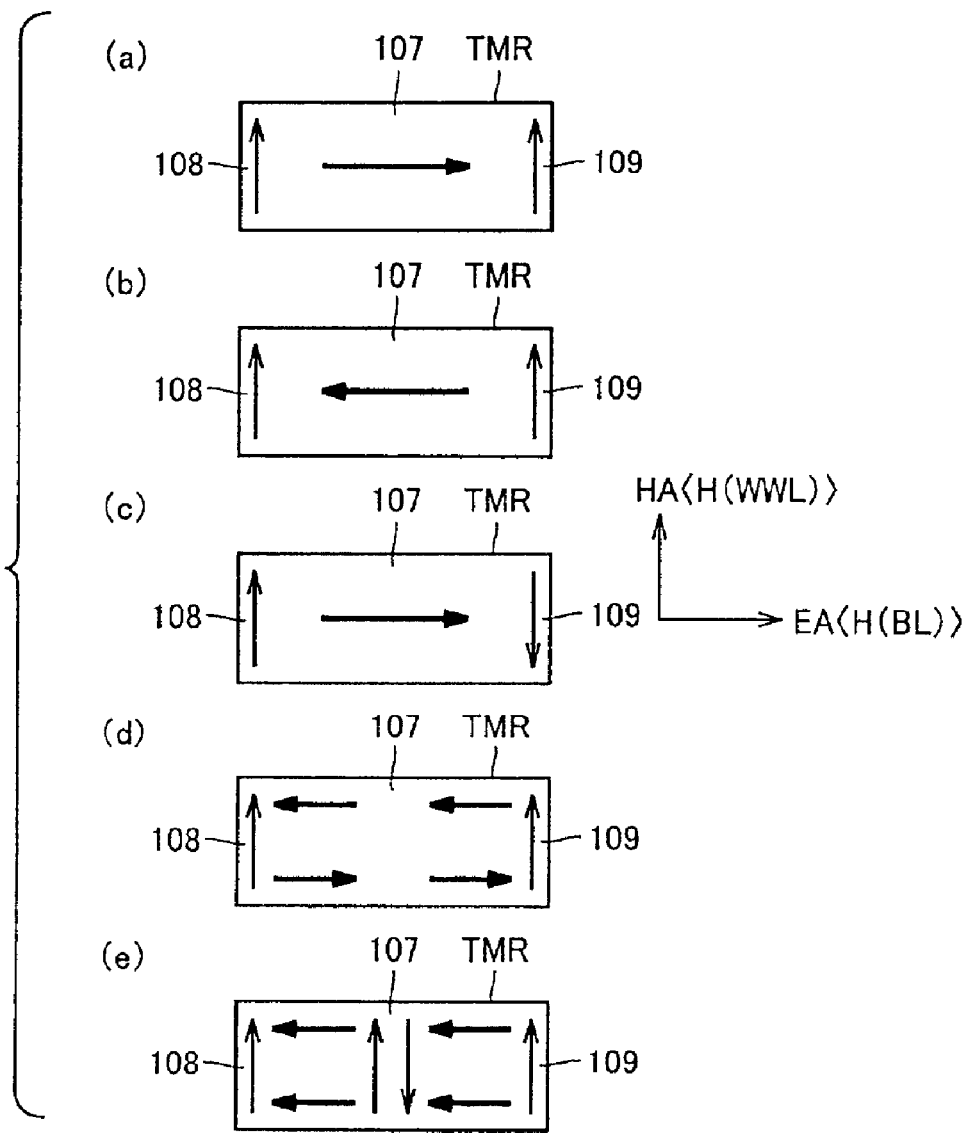
FIG. 10 is a conceptual diagram illustrating an undesirable magnetization state in a free magnetic layer.

Referring to FIG. 10, end regions 108, 109 of tunneling magneto-resistance element TMR are less likely to be magnetized in response to a magnetic field of the easy axis direction. End regions 108, 109 have a property that the direction and amount of magnetization vary gradually. In a central region 107, however, the direction and amount of magnetization are set on a binary basis in response to the magnetic field of the easy axis direction. Therefore, unlike central region 107, end regions 108, 109 have undesirable characteristics as a memory cell.

As shown in (a) or (b) in FIG. 10, the free magnetic layer of tunneling magneto-resistance element TMR would have stable magnetization characteristics if end regions 108, 109 are first magnetized in one direction along the hard axis and the central region is then magnetized along the easy axis in the direction corresponding to the write data level.

By activating column selection line CSL after write word line WWL, the data write magnetic field of the hard axis direction is applied before the data write magnetic field of the easy axis direction. As a result, end regions 108, 109 of tunneling magneto-resistance element TMR are first magnetized in one direction (upward in (a) and (b) in FIG. 9), and then the magnetization direction along the easy axis is stably reversed in central region 107.

In contrast, if write word line WWL and column selection line CSL are activated approximately simultaneously or column selection line CSL is activated before write word line WWL, the free magnetic layer would be rendered in a multi-stable state, causing a non-uniform, intermediate magnetization state other than the desirable, stable state, as shown in (c), (d) and (e) in FIG. 10.

As a result, the free magnetic layer does not have such a desired magnetization direction as shown in (a) or (b) in FIG. 10 after the data write operation. This hinders the written memory cell from having a desired electric-resistance difference corresponding to the difference in storage data levels. This causes erroneous operation, thereby destabilizing the operation of the MRAM device.

As has been described above, supplying the data write currents according to FIG. 8A enables the data write magnetic field of the hard axis direction to be generated or eliminated earlier than that of the easy axis direction at the start and end of the data write operation. Accordingly, the data write operation can be stably conducted in view of the magnetization characteristics of the MTJ memory cells.

Moreover, the time lag required for stable data write operation (the period between t1 and t2 in FIG. 8A) is provided using the processing time of the redundant determination. Therefore, stable data write operation can be realized even if supply of the data write current ±Iw is started at the earliest timing after the redundant determination.

Figure 8B:
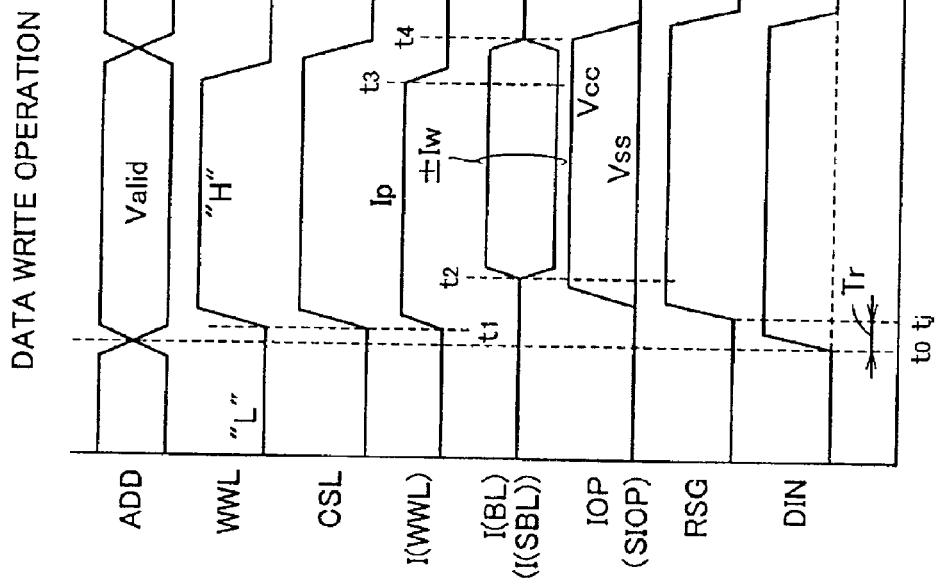
FIG. 8B is an operation waveform chart illustrating operation timing of data write operation in the MRAM device of the first embodiment.

Referring to FIG. 8B, in the data read operation as well, valid address signal ADD is applied at time t0, and read word line RWL of the selected row and column selection line CSL of the selected column are responsively activated to H level at time t1. In each sub block and spare sub block of the selected block row, data read circuit 70, 70s responsively supplies a sense current (data read current) Is to bit lines BL, /BL or spare bit lines SBL, /SBL of the selected column as a bit line current I(BL). The sense current Is thus flows through tunneling magneto-resistance element TMR.

Each data read circuit 70, 70s produces read data according to the voltage difference between local data I/O lines LIO, /LIO connected to bit lines BL, /BL of the selected column, or the voltage difference between spare local data I/O lines SLIO, /SLIO connected to spare bit lines SBL, /SBL of the selected column. A voltage on each data I/O line pair IOP and spare data I/O line pair SIOP is driven according to the read data level from the corresponding data read circuit 70, 70s. Read amplifiers RAP(1) to RAP(M), RAP(s) amplifies the (M+1) read data for transmission to data nodes Nd(1) to Nd(M) and spare data node Nds.

In the data read operation, the data is thus read from both spare memory cell and normal memory cells in parallel without waiting for completion of the redundant determination of redundant control circuit 60. Accordingly, a defective memory cell is replaced with a spare memory cell sharing write word line WWL and read word line RWL with the defective memory cell, that is, a spare memory cell of the same memory cell row.

Once the redundant determination is completed at time tj, the respective connection directions of replace switches RSW(1) to RSW(M) are appropriately set based on the redundant determination result. M-bit read data DOUT (DOUT(1) to DOUT(M)) is thus output to data terminal 4 according to the redundant determination result for replacing the defective memory cell.

As has been described above, the MRAM device of the first embodiment is capable of conducting stable data write operation at a high speed by preventing generation of the magnetically unstable, intermediate state by utilizing the time required for the redundant determination. Moreover, the MRAM device of the first embodiment is capable of conducting data read operation at a high speed by minimizing the influence of the time required for the redundant determination. This enables both improved operation speed and stabilized data write operation to be implemented in the redundant structure.

Modification of First Embodiment

In the modification of the first embodiment, the structure of the data I/O circuit for conducting redundant replacement based on a shift redundancy method rather than the direct data-line replacement using spare data I/O line pair SIOP will be described.

Figure 11:
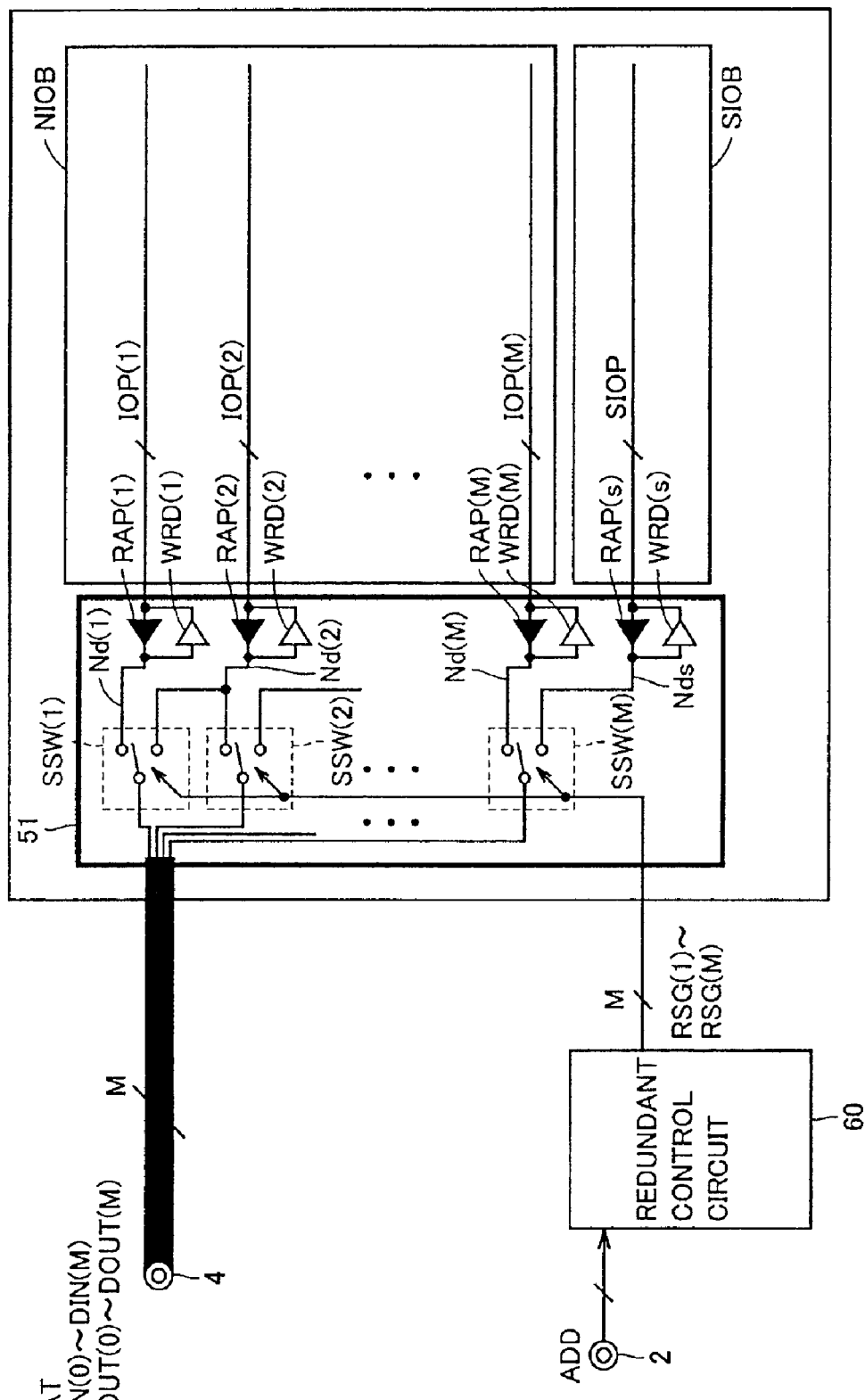
FIG. 11 is a block diagram of the structure of a data I/O circuit according a modification of the first embodiment.

Referring to FIG. 11, a data I/O circuit 51 according to the modification of the first embodiment is different from data I/O circuit 50 in FIG. 5 in that replace switches RSW(1) to RSW(M) are replaced with shift switches SSW(1) to SSW (M). Since the structure of data I/O circuit 51 is otherwise the same as that of data I/O circuit 50 in FIG. 5, detailed description thereof will not be repeated.

Each shift switch SSW(1) to SSW(M) is arranged between adjacent two of data nodes Nd(1) to Nd(M) and a spare data node Nds. Data nodes Nd(1) to Nd(M) and spare data node Nds are sequentially arranged corresponding to data I/O line pairs IOP(1) to IOP(M) and spare data I/O line pair SIOP, respectively. Each shift switch SSW(1) to SSW (M) connects one of the corresponding two nodes to data terminal 4. The connection directions of shift switches SSW(1) to SSW(M) are respectively controlled by redundant control signals RSG(1) to RSG(M). Redundant control circuit 60 produces redundant control signals RSG(1) to RSG(M) based on the redundant determination result.

For example, the first shift switch SSW(1) selectively connects either data node Nd(1) or Nd(2) to data terminal 4 according to redundant control signal RSG(1). The $M^{th}$ (last) shift switch SSW(M) selectively connects either data node Nd(M) or spare data node Nds to data terminal 4 according to redundant control signal RSG(M). Hereinafter, shift switches SSW(1) to SSW(M) are sometimes generally referred to as shift switches SSW.

The respective connection directions of shift switches SSW change at the data I/O line pair IOP corresponding to the normal IO block including a defective memory cell. For example, if the $j^{th}$ data I/O line pair IOP(j) corresponds to a defective memory cell in FIG. 11 (where j is a natural number of 2 to M), the respective connection directions of shift switches SSW(1) to SSW(j-1) are set to the normal direction (upward in FIG. 11), and the respective connection directions of shift switches SSW(j) to SSW(W) are set to the spare direction (downward in FIG. 11). If data I/O line pair IOP(1) corresponds to a defective memory cell, the respective connection directions of shift switches SSW(1) to SSW(M) are set to the spare direction (downward in FIG. 11).

In contrast, if a defective memory cell is not selected and shift redundancy of data I/O line pairs IOP is not required, the respective connection directions of shift switches SSW (1) to SSW(M) are set to the normal direction (upward).

As a result, even if a defective memory cell is selected for access, the use of shift switches SSW(1) to SSW(M) enables M-bit data signal DAT to be read or written without connecting the data I/O line pair IOP(j) corresponding to the defective memory cell to data terminal 4. In other words, M-bit data signal DAT is read or written by using the remaining (M-1) data I/O line pairs IOP and spare data I/O line pair SIOP.

Note that the structure of the modification of the first embodiment is the same as that of the first embodiment except for the data I/O circuit. Therefore, data is read from and written to each sub block SB in the same manner as that shown in the operation waveform chart of FIGS. 8A and 8B. As a result, high-speed data read operation and magnetically stable data write operation can be realized.

Second Embodiment

Figure 12:
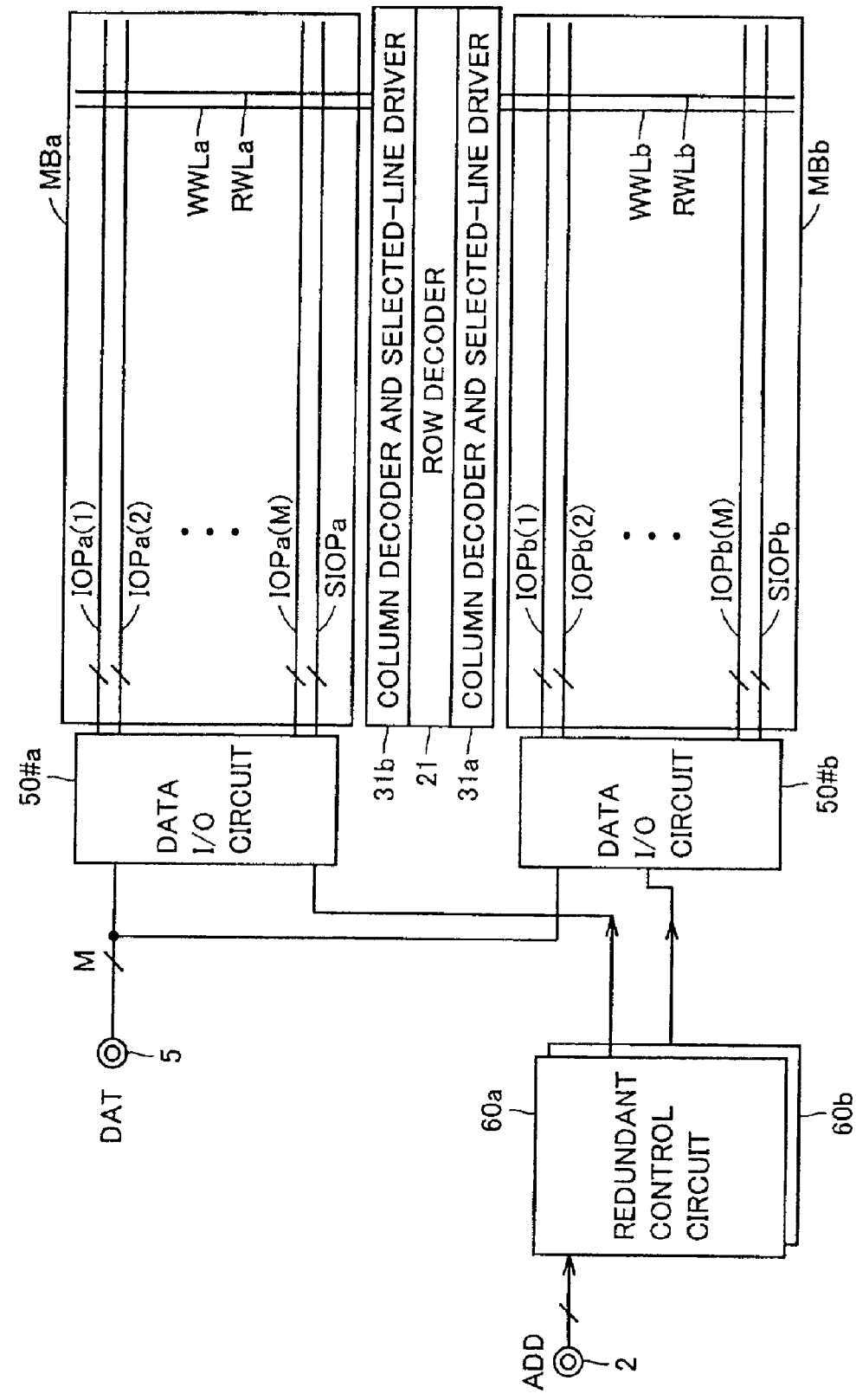
FIG. 12 is a schematic block diagram of the redundant structure in an MRAM device according to a second embodiment of the present invention.

Referring to FIG. 12, in the second embodiment, memory array 10 is divided into a plurality of memory blocks MBa, MBb along the column direction. For example, one of the plurality of memory blocks MBa, MBb is selected according to a bank address or the like. Note that, hereinafter, memory blocks MBa, MBb are sometimes generally referred to as memory blocks MB.

Each memory block Ma, Mb has the same structure as that of memory array 10 described in the first embodiment. More specifically, data I/O line pairs IOPa(1) to IOPa(M) and a spare data I/O line pair SIOPa are arranged in memory block MBa. Similarly, data I/O line pairs IOPb(1) to IOPb(M) and a spare data I/O line pair SIOPb are arranged in memory block MBb.

Read word lines RWLa, RWLb are respectively arranged in memory blocks Mba, MBb. Read word lines RWLa, RWLb correspond to the same memory cell row. Similarly, write word lines WWLa, WWLb are respectively arranged in memory blocks MBa, MBb. Write word lines WWLa, WWLb correspond to the same memory cell row.

A common row decoder 21 is provided for memory blocks MBa, MBb. Row decoder 21 selectively activates read word line RWL of the selected row (for read operation) or write word line WWL of the selected row (for write operation) in the selected memory block MB. Accordingly, row selection is not simultaneously conducted in both memory blocks MBa, MBb. In other words, row selection is conducted at an independent timing in each memory block MBa, MBb.

Column decoders and selected-line drivers 31a, 31b respectively correspond to memory blocks MBa, MBb. Column decoder and selected-line driver 31a, 31b selectively activates column selection line CSL and block row selection signal RBS in response to selection of a corresponding memory block MB. Column selection line CSL and block row selection signal RBS are the same as those shown in FIG. 2.

Independent redundant structures are provided for memory blocks MBa, MBb. More specifically, a data I/O circuit 50#a and a redundant control circuit 60a are provided for memory block MBa, and a data I/O circuit 50#b and a redundant control circuit 60b are provided for memory block MBb.

Each data I/O circuit 50#a, 50#b has the same structure as that of either data I/O circuit 50 or 51 shown in FIGS. 5 and 11.

Redundant control circuit 60a stores a pattern of fault address FADa and redundant control signal RSGa for redundant replacement in memory block MBa. Like the first embodiment, redundant control circuit 60a controls the respective connection directions of replace switches RSW or shift switches SSW in data I/O circuit 50#a based on the redundant determination result of address signal ADD and fault address FADa.

Similarly, redundant control circuit 60b stores a pattern of fault address FADb and redundant control signal RSGb for redundant replacement in memory block MBb. Like the first embodiment, redundant control circuit 60b controls the respective connection directions of replace switches RSW or shift switches SSW in data I/O circuit 50#b based on the redundant determination result of address signal ADD and fault address FADb.

The redundant structure such as redundant control circuit 60 and spare data I/O line pair SIOP used for reading from or writing to a spare memory cell is provided in every prescribed section having a common row-selection timing. In FIG. 12, the redundant structure is provided in every memory block MB.

The above structure enables M-bit data signal DAT to be input to and output from each of a plurality of memory blocks MB having independent row-selection timings, while replacing a defective memory cell.

Modification of Second Embodiment

Figure 13:
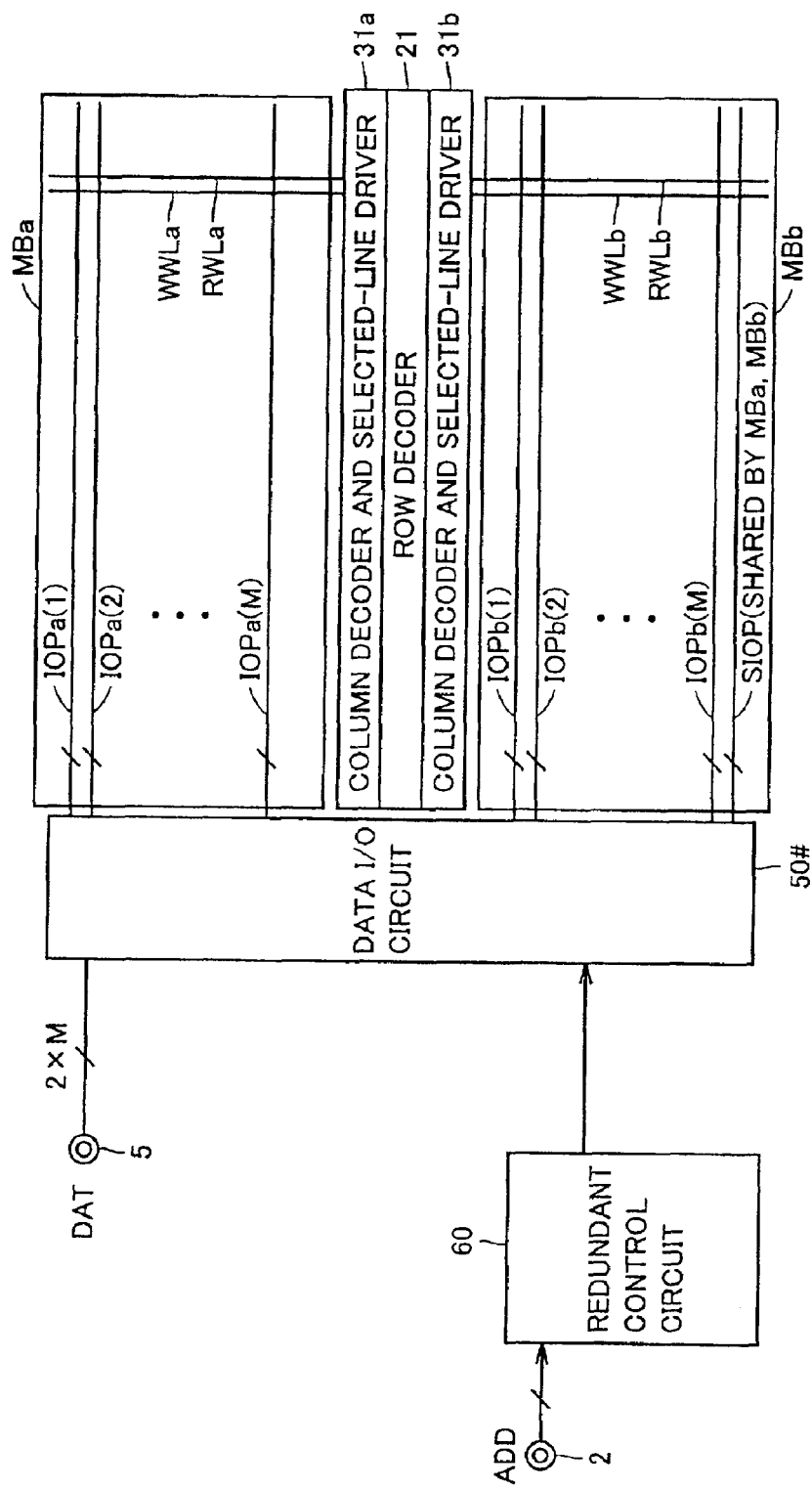
FIG. 13 is a block diagram of the redundant structure in an MRAM device according to a modification of the second embodiment.
Figure 14:
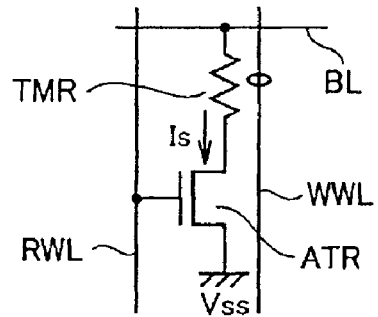
FIG. 14 schematically shows the structure of a MTJ memory cell.
Figure 15:
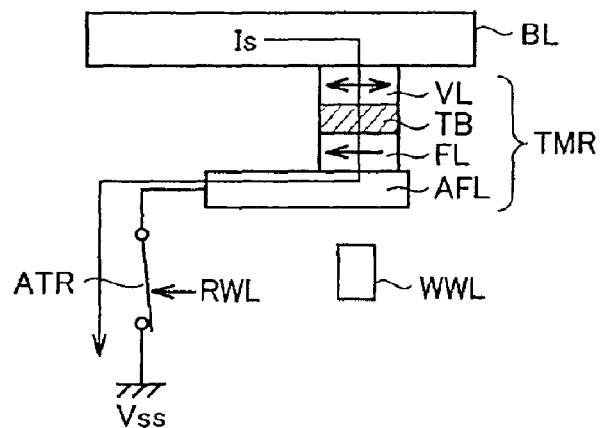
FIG. 15 is a conceptual diagram illustrating data read operation from the MTJ memory cell.
Figure 16:
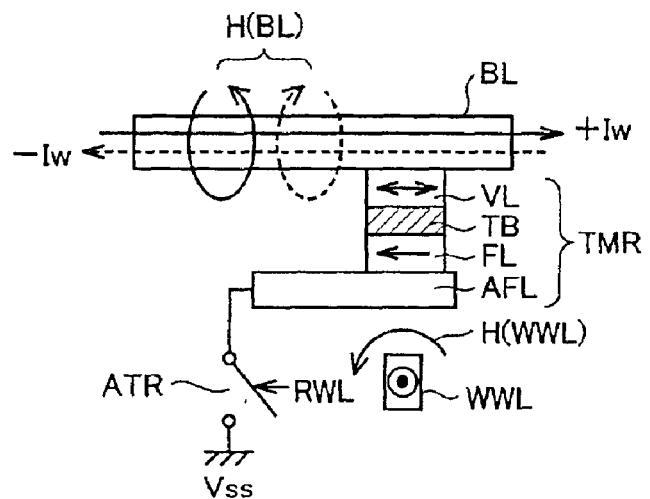
FIG. 16 is a conceptual diagram illustrating data write operation to the MTJ memory cell.

Referring to FIG. 13, the structure of the modification of the second embodiment is different from that of the second embodiment in that row selection is conducted simultaneously in both memory blocks MBa, MBb. More specifically, a read word line RWL (for data read operation) and a write word line WWL (for data write operation) are selectively activated in both memory blocks MBa, MBb according to address signal ADD.

Thus, when row selection is conducted at a common timing in both memory blocks MBa, MBb, memory blocks MBa, MBb may have a common spare IO block SIOB, that is, a common spare data I/O line pair SIOP. In the example of FIG. 13, a spare data I/O line pair SIOP of a spare IO block SIOB in memory block MBb is shared between memory blocks MBa, MBb for redundant replacement.

This allows data I/O circuit 50# and redundant control circuit 60 to be shared between memory blocks MBa, MBb, reducing the circuit area for the redundant structure.

When M data I/O line pairs IOP are arranged in each memory block MBa, MBb, a (2×M)-bit data signal DAT can be input or output while replacing a defective memory cell on the basis of a data I/O line pair IOP.

Note that the present embodiment shows the example of reading from or writing to a spare memory cell through a single spare data I/O line pair SIOP. However, a plurality of spare data I/O line pairs SIOP may be provided. In this case, each replace switch RSW in FIG. 5 may have an increased number of contact points according to the number of spare data I/O line pairs SIOP. Alternatively, shift switches SSW in FIG. 11 may be arranged in an increased number of stages according to the number of spare data I/O line pairs SIOP.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device for selecting an address according to an address signal including first and second addresses, comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of both a first prescribed magnetic field along a hard axis and a second prescribed magnetic field along an easy axis, said thin film magnetic memory device further comprising:

a redundant control circuit for comparing said address signal with a fault address designating said defective memory cell and conducting redundant determination to determine whether said defective memory cell is selected or not based on the comparison result;

a selection circuit for conducting row selection for each of said plurality of normal memory cells and said plurality of spare memory cells according to said first address regardless of said redundant determination in data write operation;

a plurality of write selection lines selectively activated according to said row selection to pass a first data write current therethrough in order to apply said first prescribed magnetic field to a normal memory cell group and a spare memory cell group of the selected row;

a plurality of data lines arranged respectively corresponding to the normal memory cell columns;

a plurality of spare data lines arranged respectively corresponding to the spare memory cell columns; and a data input/output (I/O) circuit for controlling data input/output to/from said plurality of normal memory cells and said plurality of spare memory cells according to said redundant determination, wherein in said data write operation, said data I/O circuit supplies a second data write current to either data lines corresponding to said second address, or data lines and a spare data line corresponding to said second address according to said redundant determination, said second data write current being a current for generating said second prescribed magnetic field.

2. The thin film magnetic memory device according to claim 1, wherein said first data write current has a fixed direction regardless of write data, and a direction of said second data write current is set according to a level of said write data.

3. The thin film magnetic memory device according to claim 1, wherein said plurality of spare memory cells and said plurality of normal memory cells are arranged to share the memory cell rows, said write selection lines are arranged respectively corresponding to said memory cell rows, and said defective memory cell is replaced with one of the spare memory cells of the same memory cell row.

4. The thin film magnetic memory device according to claim 1, wherein in said data write operation, said selection circuit activates at least one of said plurality of write selection lines according to said first address at a first time, and in said data write operation, said data I/O circuit starts supplying said second data write current to either said data lines corresponding to said second address, or said data lines and spare data line corresponding to said second address at a second time later than said first time.

5. The thin film magnetic memory device according to 4, wherein, in said data write operation, said redundant control circuit conducts at least a part of said redundant determination between said first and second times.

6. The thin film magnetic memory device according to claim 1, further comprising:

a data terminal receiving and outputting M-bit data in parallel (where M is an integer of at least 2);

M normal data input/output (I/O) lines arranged respectively corresponding to prescribed sections of said plurality of normal memory cells;

a spare data input/output (I/O) line corresponding to said plurality of spare memory cells;

a first connection switch circuit for connecting each of said normal data I/O lines to a single data line selected according to said second address in a corresponding prescribed section in said data write operation; and a second connection switch circuit for connecting said spare data I/O line to a single spare data line selected according to said second address in said data write operation, wherein said data I/O circuit includes a plurality of write drive circuits arranged respectively corresponding to said M normal data I/O lines and said spare data I/O line, for supplying said second data write current of a direction corresponding to received write data to a corresponding normal data I/O line or spare data I/O line, and a redundant switch circuit for connecting M write drive circuits to said data terminal to transmit said M-bit data applied to said data terminal to said M write drive circuits as said write data, said M write drive circuits being selected from said plurality of write drive circuits based on said redundant determination.

7. The thin film magnetic memory device according to claim 6, wherein, in said data write operation, said redundant switch circuit connects a write drive circuit of said spare data I/O line to said data terminal in place of a write drive circuit of a normal data I/O line corresponding to said defective memory cell, based on said redundant determination.

8. The thin film magnetic memory device according to claim 6, wherein said redundant switch circuit includes a plurality of shift switches each provided between adjacent two of said plurality of write drive circuits arranged sequentially, for connecting one of corresponding two write drive circuits to said data terminal, and respective connections of said shift switches are controlled based on said redundant determination so that a write drive circuit of a normal data I/O line corresponding to said defective memory cell is not connected to said data terminal and the remaining write drive circuits are connected to said data terminal.

9. The thin film magnetic memory device according to claim 1, wherein said plurality of memory cells are divided into a plurality of memory blocks for which row selection is conducted independently of each other, and said plurality of spare memory cells, said redundant control circuit and said data I/O circuit are provided in every memory block.

10. A thin film magnetic memory device for selecting an address according to an address signal including first and second addresses, comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of both first and second prescribed write magnetic fields, and an access element electrically coupled in series with said magneto-resistance element, and selectively turned ON to pass a data read current therethrough in a data read operation, said thin film magnetic memory device further comprising:

a redundant control circuit for comparing said address signal with a fault address designating said defective memory cell and conducting redundant determination to determine whether said defective memory cell is selected or not based on the comparison result;

a selection circuit for conducting row selection for each of said plurality of normal memory cells and said plurality of spare memory cells according to said first address regardless of said redundant determination in data read operation;

a plurality of read selection lines selectively activated according to said row selection to turn ON said access element in each of a normal memory cell group and a spare memory cell group of the selected row;

a plurality of data lines arranged respectively corresponding to the normal memory cell columns, and respectively connected to the normal memory cells of the selected row in said data read operation;

a plurality of spare data lines arranged respectively corresponding to the spare memory cell columns, and respectively connected to the spare memory cells of the selected row in said data read operation;

a first data read circuit for supplying said data read current to selected data lines regardless of said redundant determination in said data read operation, said selected data lines being selected from said plurality of data lines according to said second address;

a second data read circuit for supplying said data read current to at least one selected spare data line regardless of said redundant determination in said data read operation;

a data input/output (I/O) circuit for receiving a plurality of read data from said selected data lines and said at least one selected spare data line receiving said data read current, and selectively outputting a part of said plurality of read data based on said redundant determination, in said data read operation.

11. The thin film magnetic memory device according to 10, wherein, in said data read operation, said first and second data read circuits start supplying said data read current in parallel regardless of said redundant determination.

12. The thin film magnetic memory device according to claim 10, wherein said first data read circuit includes a first amplifier circuit for producing read data according to a voltage on said selected data lines receiving said data read current, said second data read circuit includes a second amplifier circuit for producing read data according to a voltage on said selected spare data line receiving said data read current, said data I/O circuit includes third amplifier circuits provided respectively corresponding said first and second amplifier circuits, for further amplifying said read data received from a corresponding first or second amplifier circuit, and at least said first and second amplifier circuits operate in parallel regardless of said redundant determination.

13. The thin film magnetic memory device according to claim 10, further comprising:

a data terminal receiving and outputting M-bit data in parallel (where M is an integer of at least 2);

M normal data input/output (I/O) lines arranged respectively corresponding to prescribed sections of said plurality of normal memory cells; and a spare data input/output (I/O) line corresponding to said plurality of spare memory cells, wherein said first data read circuit is provided in each of said prescribed sections, said thin film magnetic memory device further comprising:

a first connection switch circuit provided in each of said prescribed sections, for transmitting said read data from a corresponding first data read circuit to a corresponding normal data I/O line in said data read operation; and a second connection switch circuit for transmitting said read data from said second data read circuit to said spare data I/O line in said data read operation, wherein said data I/O circuit includes a redundant switch circuit for connecting M data I/O lines to said data terminal, said M data I/O lines being selected from said M normal data I/O lines and said spare data I/O line based on said redundant determination.

14. The thin film magnetic memory device according to claim 13, wherein, in said data read operation, said redundant switch circuit connects said spare data I/O line to said data terminal in place of a normal data I/O line corresponding to said defective memory cell, based on said redundant determination.

15. The thin film magnetic memory device according to 13, wherein said redundant switch circuit includes a plurality of shift switches each provided between adjacent two data I/O lines of said M normal data I/O lines and said spare data I/O line which are arranged sequentially, for connecting one of corresponding two data I/O lines to said data terminal, and respective connections of said shift switches are controlled based on said redundant determination so that a normal data I/O line corresponding to said defective memory cell is not connected to said data terminal and the remainder of said normal data I/O lines and said spare data I/O line are connected to said data terminal.

16. A thin film magnetic memory device comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of both first and second prescribed magnetic field, said thin film magnetic memory device further comprising:

a redundancy determination circuit for judging whether said defective memory cell is accessed by input address and whether it should be replaced by said spare memory cells, whereby said first prescribed write magnetic field is applied to both the selected normal memory cells and the selected spare memory cells corresponding to the selected normal memory cells, and said second prescribed write magnetic field is applied to either the selected normal memory cells or the selected spare memory cells in accordance with the redundancy determination result of said redundancy determination circuit.

17. The thin film magnetic memory device according to claim 16, wherein, apart of said plurality of normal memory cells and a part of said plurality of spare memory cells capable of replacing said defective memory cell in said part of said plurality of normal memory cells are selected by the same row address.

18. The thin film magnetic memory device according to claim 17, further comprising a plurality of first current lines for selectively passing a data write current therethrough in order to generate said first prescribed write magnetic field wherein,
a part of said plurality of normal memory cells and a part of said plurality of spare memory cells capable of replacing said defective memory cell in said part of said plurality of normal memory cells share the same first current line corresponding to the same row address.

19. The thin film magnetic memory device according to claim 16, further comprising a plurality of first current lines for selectively passing a data write current therethrough in order to generate said first prescribed write magnetic field wherein,
a part of said plurality of normal memory cells and a part of said plurality of spare memory cells capable of replacing said defective memory cell in said part of said plurality of normal memory cells share the same first current line share the same first current line.

20. The thin film magnetic memory device according to claim 16, wherein
said matrix includes rows shared by said normal memory cells, normal columns of said plurality of normal memory cells and spare columns of said plurality of spare memory cells, and
said thin film magnetic memory device further comprises:
a plurality of first current lines arranged corresponding to respective said rows, and selectively activated by said selection circuit to pass a first data write current therethrough in order to generate said first prescribed write magnetic field, wherein
said defective memory cell is replaced with one of the spare memory cells of the same row.

21. The thin film magnetic memory device according to claim 16, wherein
said matrix include rows shared by said normal memory cells, normal columns of said plurality of normal memory cells and spare columns of said plurality of spare memory cells, and
said thin film magnetic memory device further comprising:
a plurality of first current lines arranged corresponding to respective said rows, and selectively activated by said selection circuit to pass a first data write current therethrough in order to generate said first prescribed write magnetic field;
a plurality of data lines arranged corresponding to respective said normal columns, and for selectively passing a second data write current therethrough in order to generate said second prescribed write magnetic field;
a plurality of spare data lines arranged corresponding to respective said spare columns, and for selectively passing said second data write current therethrough; and
a data input circuit for controlling data input to said plurality of normal memory cells and said plurality of spare memory cells according to said redundant determination, wherein
in said data write operation, at least one of said plurality of first current lines is selected to pass said first data write current therethrough according to a first portion of said input address at a first time, and
in said data write operation, said data input circuit supplies said second data write current to either data lines corresponding to a second portion of said input address, or data lines and a spare data line corresponding to said second portion, in accordance with the redundant determination of said redundancy determination circuit, at a second time later than said first time.

22. The thin film magnetic memory device according to 21, wherein, in said data write operation, said redundancy determination circuit conducts at least a part of the redundant determination between said first and second times.

23. The thin film magnetic memory device according to claim 16, wherein
said matrix include rows shared by said normal memory cells, normal columns of said plurality of normal memory cells and spare columns of said plurality of spare memory cells, and
said thin film magnetic memory device further comprising:
a selection circuit for selecting said rows according to a first portion of said input address regardless of the redundant determination of said redundancy determination circuit, in data write operation;
a plurality of first current lines arranged corresponding to respective said rows, and selectively activated by said selection circuit to pass a first data write current therethrough in order to generate said first prescribed write magnetic field;
a plurality of data lines arranged corresponding to respective said normal columns, and for selectively passing a second data write current therethrough in order to generate said second prescribed write magnetic field;
a plurality of spare data lines arranged corresponding to respective said spare columns, and for selectively passing said second data write current therethrough;
a data input circuit for controlling data input to said plurality of normal memory cells and said plurality of spare memory cells in accordance with the redundant determination of said redundancy determination circuit, said data input circuit supplying said second data write current to either data lines corresponding to a second portion of said input address, or data lines and a spare data line corresponding to said second portion, in accordance with the redundant determination, in said data write operation;
a data terminal receiving and outputting M-bit data in parallel (where M is an integer of at least 2);
M normal data input/output (I/O) lines arranged respectively corresponding to prescribed sections of said plurality of normal memory cells;
a spare data input/output (I/O) line corresponding to said plurality of spare memory cells;
a first connection switch circuit for connecting each of said normal data I/O lines to a single data line selected according to said second portion of said input address in a corresponding prescribed section in said data write operation; and
a second connection switch circuit for connecting said spare data I/O line to a single spare data line selected according to said second portion in said data write operation, wherein
said data input circuit includes
a plurality of write drive circuits arranged respectively corresponding to said M normal data I/O lines and said spare data I/O line, for supplying said second data write current of a direction corresponding to received write data to a corresponding normal data I/O line or spare data I/O line, and a redundant switch circuit for connecting M write drive circuits to said data terminal to transmit said M-bit data applied to said data terminal to said M write drive circuits as said write data, said M write drive circuits being selected from said plurality of write drive circuits based on the redundant determination of said redundancy determination circuit.

24. The thin film magnetic memory device according to claim 23, wherein, in said data write operation, said redundant switch circuit connects a write drive circuit of said spare data I/O line to said data terminal in place of a write drive circuit of a normal data I/O line corresponding to said defective memory cell, based on the redundant determination of said redundancy determination circuit.

25. The thin film magnetic memory device according to claim 23, wherein said redundant switch circuit includes a plurality of shift switches each provided between adjacent two of said plurality of write drive circuits arranged sequentially, for connecting one of corresponding two write drive circuits to said data terminal, and respective connections of said shift switches are controlled based on said redundant determination so that a write drive circuit of a normal data I/O line corresponding to said defective memory cell is not connected to said data terminal and the remaining write drive circuits are connected to said data terminal.

26. The thin film magnetic memory device according to claim 16, wherein said plurality of memory cells are divided into a plurality of memory blocks for which row selection is conducted independently of each other, and said plurality of spare memory cells, said redundancy determination circuit and said data input circuit are provided in every memory block.

27. A thin film magnetic memory device for selecting an address according to an address signal including first and second addresses, comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of both a first prescribed magnetic field along a hard axis and a second prescribed magnetic field along an easy axis, said thin film magnetic memory device further comprising:

a redundancy control circuit for comparing said address signal with a fault address designating said defective memory cell and conducting redundant determination to determine whether said defective memory cell is selected or not based on the comparison result;

a selection circuit for conducting row selection for each of said plurality of normal memory cells and said plurality of spare memory cells according to said first address regardless of said redundant determination in data write operation;

a plurality of write selection lines selectively activated according to said row selection to pass a first data write current therethrough in order to apply said first prescribed magnetic field to a normal memory cell group and a spare memory cell group of the selected row; and a data input circuit for controlling data input to said plurality of normal memory cells and said plurality of spare memory cells according to said redundant determination, wherein in said data write operation, said data input circuit supplies a second data write current to either data lines corresponding to said second address, or data lines and a spare data line corresponding to said second address according to said redundant determination, said second data write current being a current for generating said second prescribed magnetic field.

28. The thin film magnetic memory device according to claim 27, wherein said first data write current has a fixed direction regardless of write data, and a direction of said second data write current is set according to said write data.

29. A thin film magnetic memory device comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction, and an access element electrically coupled in series with said magneto-resistance element, and selectively turned ON to pass a data read current therethrough in a data read operation, said thin film magnetic memory device further comprising:

a redundancy determination circuit for judging whether said defective memory cell is accessed by input address and whether it should be replaced by said spare memory cells, said redundancy determination circuit comparing said input address with a fault address designating said defective memory cell and conducting redundant determination to determine whether said defective memory cell is selected or not based on the comparison result;

a selection circuit for conducting row selection for each of said plurality of normal memory cells and said plurality of spare memory cells according to first portion of said input address regardless of said redundant determination in data read operation;

a plurality of read selection lines selectively activated according to said row selection to turn ON said access element in each of a normal memory cell group and a spare memory cell group of the selected row;

a plurality of data lines arranged respectively corresponding to the normal memory cell columns, and respectively connected to the normal memory cells of the selected row in said data read operation;

a plurality of spare data lines arranged respectively corresponding to the spare memory cell columns, and respectively connected to the spare memory cells of the selected row in said data read operation;

a first data read circuit for supplying said data read current to selected data lines regardless of said redundant determination in said data read operation, said selected data lines being selected from said plurality of data lines according to a second portion of said input address;

a second data read circuit for supplying said data read current to at least one selected spare data line regardless of said redundant determination in said data read operation;

a data output circuit for receiving a plurality of read data from said selected data lines and said at least one selected spare data line receiving said data read current, and selectively outputting a part of said plurality of read data based on said redundant determination, in said data read operation.

30. The thin film magnetic memory device according to claim 29, wherein, a part of said plurality of normal memory cells and a part of said plurality of spare memory cells capable of replacing said defective memory cell in said part of said plurality of normal memory cells share the same read selection line.

31. The thin film magnetic memory device according to claim 29, wherein, a part of said plurality of normal memory cells and a part of said plurality of spare memory cells capable of replacing said defective memory cell in said part of said plurality of normal memory cells are selected by the same row address.

32. The thin film magnetic memory device according to 29, wherein, in said data read operation, said first and second data read circuits start supplying said data read current in parallel regardless of said redundant determination.

33. The thin film magnetic memory device according to claim 29, wherein said first data read circuit includes a first amplifier circuit for producing read data according to a voltage on said selected data lines receiving said data read current, said second data read circuit includes a second amplifier circuit for producing read data according to a voltage on said selected spare data line receiving said data read current, said data output circuit includes third amplifier circuits provided respectively corresponding said first and second amplifier circuits, each for further amplifying said read data received from a corresponding first or second amplifier circuit, and at least said first and second amplifier circuits operate in parallel regardless of said redundant determination.

34. The thin film magnetic memory device according to claim 29, further comprising:

a data terminal receiving and outputting M-bit data in parallel (where M is an integer of at least 2);

M normal data input/output (I/O) lines arranged respectively corresponding to prescribed sections of said plurality of normal memory cells; and a spare data input/output (I/O) line corresponding to said plurality of spare memory cells, wherein said first data read circuit is provided in each of said prescribed sections, said thin film magnetic memory device further comprising:

a first connection switch circuit provided in each of said prescribed sections, for transmitting said read data from a corresponding first data read circuit to a corresponding normal data I/O line in said data read operation; and a second connection switch circuit for transmitting said read data from said second data read circuit to said spare data I/O line in said data read operation, wherein said data output circuit includes a redundant switch circuit for connecting M data I/O lines to said data terminal, said M data I/O lines being selected from said M normal data I/O lines and said spare data I/O line based on said redundant determination.

35. The thin film magnetic memory device according to claim 34, wherein, in said data read operation, said redundant switch circuit connects said spare data I/O line to said data terminal in place of a normal data I/O line corresponding to said defective memory cell, based on said redundant determination.

36. The thin film magnetic memory device according to 34, wherein said redundant switch circuit includes a plurality of shift switches each provided between adjacent two data I/O lines of said M normal data I/O lines and said spare data I/O line which are arranged sequentially, for connecting one of corresponding two data I/O lines to said data terminal, and respective connections of said shift switches are controlled based on said redundant determination so that a normal data I/O line corresponding to said defective memory cell is not connected to said data terminal and the remainder of said normal data I/O lines and said spare data I/O line are connected to said data terminal.

37. A thin film magnetic memory device, comprising:

a plurality of memory cell arranged in a matrix and divided into a plurality of memory cell group each for storing (N+m) bits (where N is an integer of at least 2, and m is an integer), and capable of replacing a defective memory, wherein each of said plurality of memory cell includes a magneto-resistance element having its electric resistance varying according to a magnetization direction that is rewritable in response to application of both first and second prescribed magnetic field, said thin film magnetic memory device further comprising:

a redundancy determination circuit for judging whether the accessed memory cell group contains said defective memory cell and whether it should be replaced by another memory cell in the same memory cell group, whereby said first prescribed write magnetic field is applied to all the memory cells of(N+m) bits in the accessed memory cell group, and said second prescribed write magnetic field is applied to the effective memory cells of N bits in the accessed memory cell group, in accordance with the redundancy determination result of said redundancy determination circuit.

38. A thin film magnetic memory device, comprising:

a plurality of memory cell arranged in a matrix and divided into a plurality of memory cell group each for storing (N+m) bits (where N is an integer of at least 2, and m is an integer), and capable of replacing a defective memory, wherein each of said plurality of memory cell includes a magneto-resistance element having its electric resistance varying according to a magnetization direction, said thin film magnetic memory device further comprising:

a redundancy determination circuit for judging whether the accessed memory cell group contains said defective memory cell and whether it should be replaced by another memory cell in the same memory cell group, whereby in the data read operation, read data of (N+m) bits are read from all the memory cells in the accessed memory cell group, and effective data of N bits are selected out of said read data of (N+m) bits, in accordance with the redundancy determination result of said redundancy determination circuit.

39. A magnetic thin-film memory device comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of both first and second prescribed magnetic field, said thin film magnetic memory device further comprising:

a redundancy determination circuit for judging whether said defective memory cell is accessed by input address and whether it should be replaced by said spare memory cells; and a plurality of first current lines selectively activated according to a portion of said input address to pass a first data write current therethrough in order to generate said first prescribed write magnetic field, wherein a part of said plurality of normal memory cells and a part of said plurality of spare memory cells capable of replacing said defective memory cell in said part of said plurality of normal memory cells share the same first current line.

40. A thin film magnetic memory device comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include
 a magneto-resistance element having its electric resistance varying according to a magnetization direction, and
 an access element electrically coupled in series with said magneto-resistance element, and selectively turned ON to pass a data read current therethrough in a data read operation, said thin film magnetic memory device further comprising:

a redundancy determination circuit for judging whether said defective memory cell is accessed by input address and whether it should be replaced by said spare memory cells, said redundancy determination circuit comparing said input address with a fault address designating said defective memory cell and conducting redundant determination to determine whether said defective memory cell is selected or not based on the comparison result;

a plurality of read selection lines selectively activated according to a portion of said input address to turn ON said access element; wherein a part of said plurality of normal memory cells and a part of said plurality of spare memory cells capable of replacing said defective memory cell in said part of said plurality of normal memory cells share the same read selection line.

41. A thin film magnetic memory device, comprising:

a plurality of memory cell arranged in a matrix and divided into a plurality of memory cell group each for storing (N+m) bits (where N is an integer of at least 2, and m is an integer), and capable of replacing a defective memory, wherein each of said plurality of memory cell includes a magneto-resistance element having its electric resistance varying according to a magnetization direction that is rewritable in response to application of both first and second prescribed magnetic field, said thin film magnetic memory device further comprising:

a redundancy determination circuit for judging whether the accessed memory cell group contains said defective memory cell and whether it should be replaced by another memory cell in the same memory cell group; and a plurality of first current lines selectively activated to pass a first data write current therethrough in order to generate said first prescribed write magnetic field, wherein all the memory cells in the same memory cell group share the same first current line.

42. A thin film magnetic memory device, comprising:

a plurality of memory cell arranged in a matrix and divided into a plurality of memory cell group each for storing (N+m) bits (where N is an integer of at least 2, and m is an integer), and capable of replacing a defective memory, wherein each of said plurality of memory cells includes
 a magneto-resistance element having its electric resistance varying according to a magnetization direction, and
 an access element electrically coupled in series with said magneto-resistance element, and selectively turned ON to pass a data read current therethrough in a data read operation, said thin film magnetic memory device further comprising:

a redundancy determination circuit for judging whether the accessed memory cell group contains said defective memory cell and whether it should be replaced by another memory cell in the same memory cell group, and a plurality of read selection lines selectively activated to turn ON said access element in each of said memory cells in the accessed memory cell group, wherein all the memory cells in the same memory cell group share the same read selection line.

43. A thin film magnetic memory device comprising:

a plurality of normal memory cells, and a plurality of spare memory cells for replacing a defective memory cell in said plurality of normal memory cells, said normal memory cells and said spare memory cells being arranged in a matrix, wherein each normal memory cell and each spare memory cell include a magneto-resistance element having its electric resistance varying according to a magnetization direction that is rewritable in response to application of at least one prescribed write magnetic field, said thin film magnetic memory device further comprising:

a redundancy determination circuit for judging whether said defective memory cell is accessed by input address and whether it should be replaced by said spare memory cells, whereby said prescribed write magnetic field is applied to both the selected normal memory cells and the selected spare memory cells corresponding to the selected normal memory cells.

44. The thin film magnetic memory device according to claim 43, further comprising a plurality of current lines for passing write current to produce said prescribed write magnetic field, wherein said plurality of normal memory cells, said plurality of spare memory cells and said plurality of current lines are arranged such that said prescribed write magnetic field produced by same one of said plurality of current lines is commonly applied to the selected normal memory cells and the selected spare memory cells corresponding to the selected normal memory cells.

45. The thin film magnetic memory device according to claim 43, further comprising a plurality of current lines for passing write current to produce said prescribed write magnetic field, wherein said plurality of normal memory cells, said plurality of spare memory cells and said plurality of current lines are arranged such that the selected normal memory cells and the selected spare memory cells corresponding share same one of said plurality of current lines.

* * * * *